US011342928B1

(12) United States Patent
Bahr et al.

(10) Patent No.: US 11,342,928 B1
(45) Date of Patent: May 24, 2022

(54) MOLECULAR CLOCK CALIBRATION

(71) Applicant: Texas Instruments Incorporated, Dallas, TX (US)

(72) Inventors: Bichoy Bahr, Allen, TX (US); Baher Haroun, Allen, TX (US); Swaminathan Sankaran, Allen, TX (US); Juan Alejandro Herbsommer, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/460,575

(22) Filed: Aug. 30, 2021

(51) Int. Cl.
*H03L 7/197* (2006.01)
*H03L 7/081* (2006.01)
*H03L 7/099* (2006.01)
*H03L 7/093* (2006.01)

(52) U.S. Cl.
CPC ............ *H03L 7/1976* (2013.01); *H03L 7/081* (2013.01); *H03L 7/093* (2013.01); *H03L 7/0992* (2013.01)

(58) Field of Classification Search
CPC ........ H03L 7/1976; H03L 7/081; H03L 7/093
See application file for complete search history.

(56) References Cited

U.S. PATENT DOCUMENTS

| | | | | |
|---|---|---|---|---|
| 10,003,374 B1* | 6/2018 | Lee | ........................... | H03F 3/19 |
| 2008/0056337 A1* | 3/2008 | Tai | ........................ | H03B 21/02 |
| | | | | 375/219 |
| 2008/0069286 A1* | 3/2008 | Staszewski | ........... | H03L 7/1806 |
| | | | | 375/376 |
| 2010/0135368 A1* | 6/2010 | Mehta | ................. | H04L 27/3881 |
| | | | | 375/219 |
| 2019/0058478 A1* | 2/2019 | Fry | ........................... | H03B 5/32 |
| 2019/0235445 A1* | 8/2019 | Han | ........................ | H03L 7/099 |
| 2020/0021296 A1* | 1/2020 | Spijker | ..................... | H03L 7/07 |

FOREIGN PATENT DOCUMENTS

| | | | | |
|---|---|---|---|---|
| CN | 113328745 A | * | 8/2021 | |
| EP | 1814230 A1 | * | 8/2007 | ............. H03L 7/093 |

OTHER PUBLICATIONS

Wang et al.: "Chip-Scale Molecular Clock", IEEE Journal of Solid-State Circuits, vol. 54, No. 4, Apr. 2019, pp. 914-926.
Curtis Barrett: "Fractional/Integer-N PLL Basics", Texas Instruments Technical Brief SWRA029, Wireless Communication Business Unit, Aug. 1999.

* cited by examiner

*Primary Examiner* — Adam D Houston
(74) *Attorney, Agent, or Firm* — Michael A. Davis, Jr.; Charles A. Brill; Frank D. Cimino

(57) ABSTRACT

A method, providing an oscillator output signal to reference inputs of a PLL and an output clock circuit; providing a first divisor value to a control input of the PLL to regulate a closed loop that includes a physics cell, a receiver, and the PLL; providing a second divisor value to a control input of the output clock circuit to control an output frequency of an output clock signal; shifting the first divisor value in a first direction to cause a perturbation in the closed loop; shifting the second divisor value in an opposite second direction to counteract a response of the closed loop to the perturbation and to regulate the output frequency of the output clock signal; and based on the receiver output signal, analyzing the response of the closed loop to the perturbation.

20 Claims, 14 Drawing Sheets

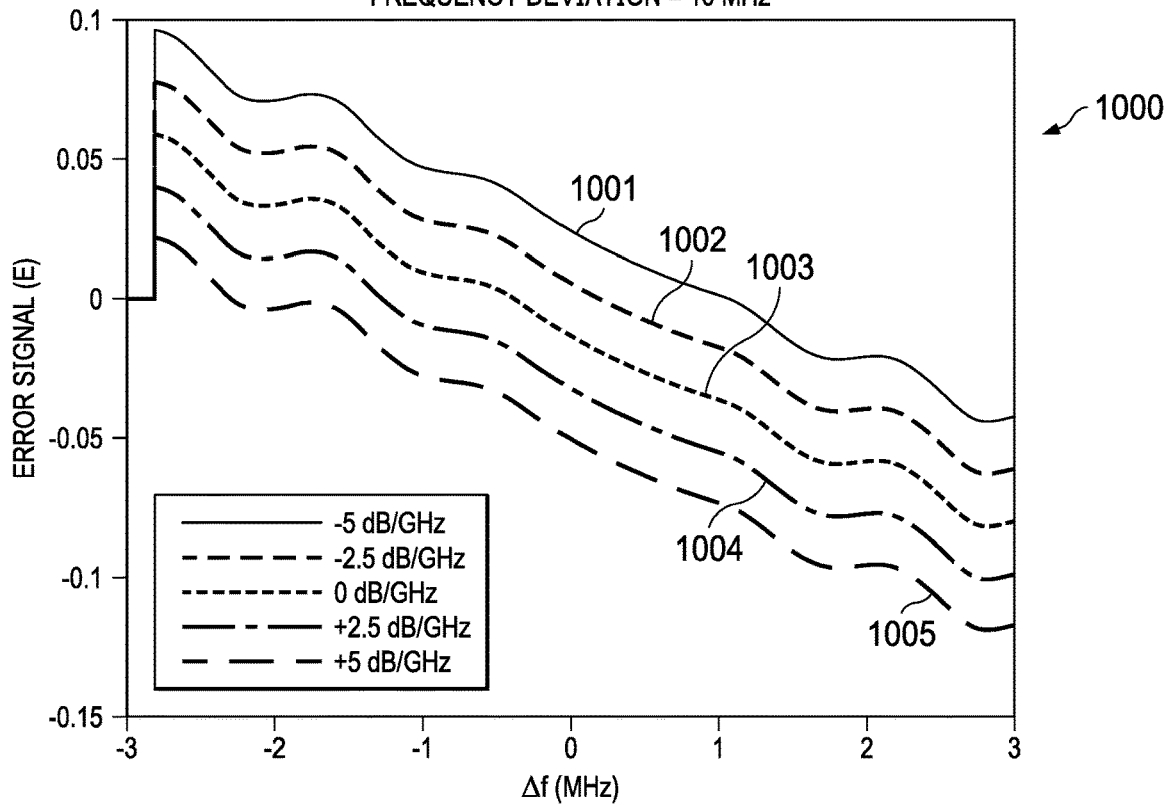
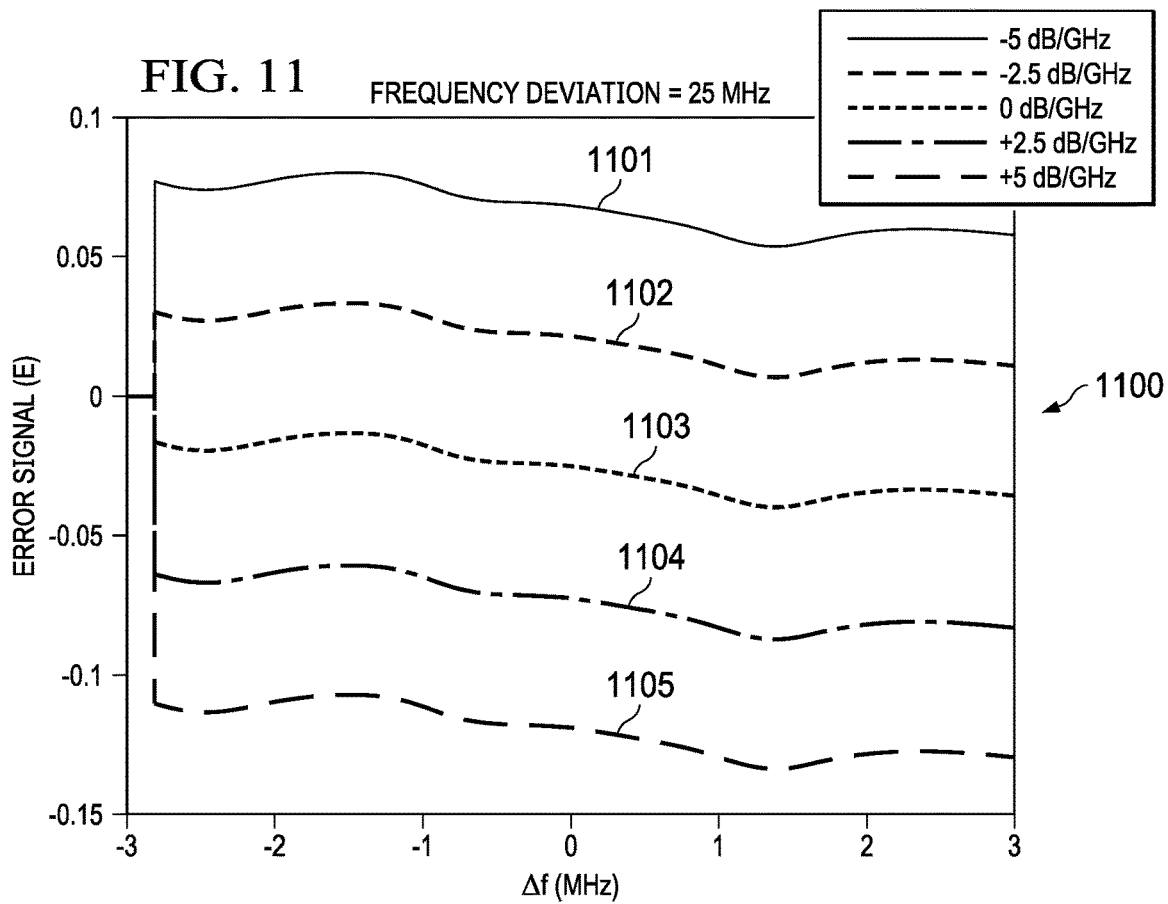

US 11,342,928 B1

MOLECULAR CLOCK CALIBRATION

BACKGROUND

Molecular or atomic clocks include a signal channel with a transmitter, a physics cell, and a receiver, and a reference oscillator provides a reference signal to an input of the transmitter. The molecular clock includes a feedback path to correct the frequency of the reference oscillator based on an error signal from the molecular clock loop. However, drift, error signals and/or noise in the signal channel cannot be corrected by calibration in the closed loop.

SUMMARY

In one aspect, an electronic device comprises an oscillator input terminal, an output terminal, a physics cell, a receiver, and a transmitter. An input of the receiver is coupled to an output of the physics cell. The transmitter has a signal input, a signal output, an analog to digital converter (ADC), a phase-locked-loop (PLL), an output clock circuit, and a controller. The signal input is coupled to an output of the receiver. The signal output is coupled to the input of the physics cell. An input of the ADC is coupled to the signal input. A reference input of the PLL is coupled to the oscillator input terminal, and an output of the PLL is coupled to a signal output of the transmitter. An input of the controller is coupled to the output of the ADC. A first control output of the controller is coupled to a control input of the PLL. A control input of the output clock circuit is coupled to a second control output of the controller. A reference input of the output clock circuit is coupled to the oscillator input terminal. An output of the output clock circuit is coupled to the output terminal. The controller is configured to provide a first divisor value at the first control output based on a signal at the input of the controller. The controller is configured to provide a divisor value at the second control output based on the signal at the input of the controller.

In another aspect, an electronic device comprises an oscillator input terminal, an output terminal, a physics cell, a receiver, and a transmitter. An input of the receiver is coupled to an output of the physics cell. The transmitter has a signal input, a signal output, an ADC, a PLL, and a controller. The signal input is coupled to an output of the receiver. The signal output is coupled to an input of the physics cell. An input of the ADC is coupled to the signal input. A reference input of the PLL is coupled to the oscillator input terminal. An output of the PLL is coupled to a signal output of the transmitter. An input of the controller is coupled to an output of the ADC. A first control output of the controller is coupled to a control input of the PLL. A second control output of the controller is coupled to the output terminal. The controller is configured to provide a first divisor value at the first control output based on a signal at the input of the controller. The controller is configured to provide a second divisor value at the second control output based on the signal at the input of the controller.

In another aspect, a method comprises providing an oscillator output signal to a reference input of a PLL and to a reference input of an output clock circuit; providing a first divisor value to a control input of the PLL to regulate a closed loop that includes a physics cell, a receiver, and the PLL based on a receiver output signal; and providing a second divisor value to a control input of the output clock circuit to control an output frequency of an output clock signal based on the receiver output signal.

BRIEF DESCRIPTION OF THE DRAWINGS

FIGS. 9-11 are graphs of error signal as a function of frequency for progressively larger modulation depths in the baseline slope calibration.

DETAILED DESCRIPTION

Figure 1:
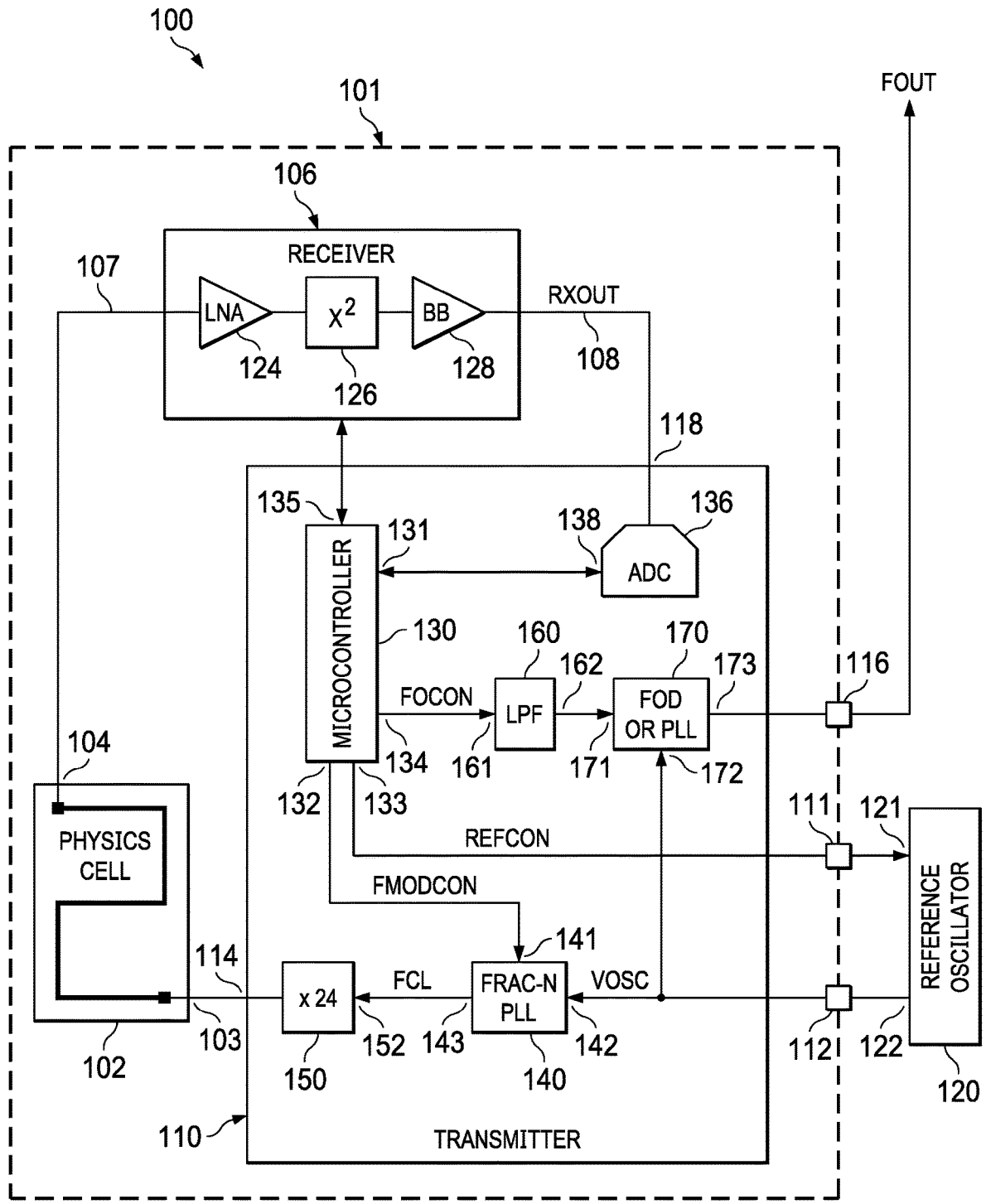
FIG. 1 is a schematic diagram of a clock system with a PLL, transmitter, physics cell, and a receiver in a closed loop, and an output clock circuit to provide an output clock signal.

In the drawings, like reference numerals refer to like elements throughout, and the various features are not necessarily drawn to scale. Also, the term "couple" or "couples" includes indirect or direct electrical or mechanical connection or combinations thereof. For example, if a first device couples to or is coupled with a second device, that connection may be through a direct electrical connection, or through an indirect electrical connection via one or more intervening components and/or devices and connections. One or more operational characteristics of various circuits, systems and/or components are hereinafter described in the context of functions which in some cases result from configuration and/or interconnection of various structures when circuitry is powered and operating.

Figure 1A:
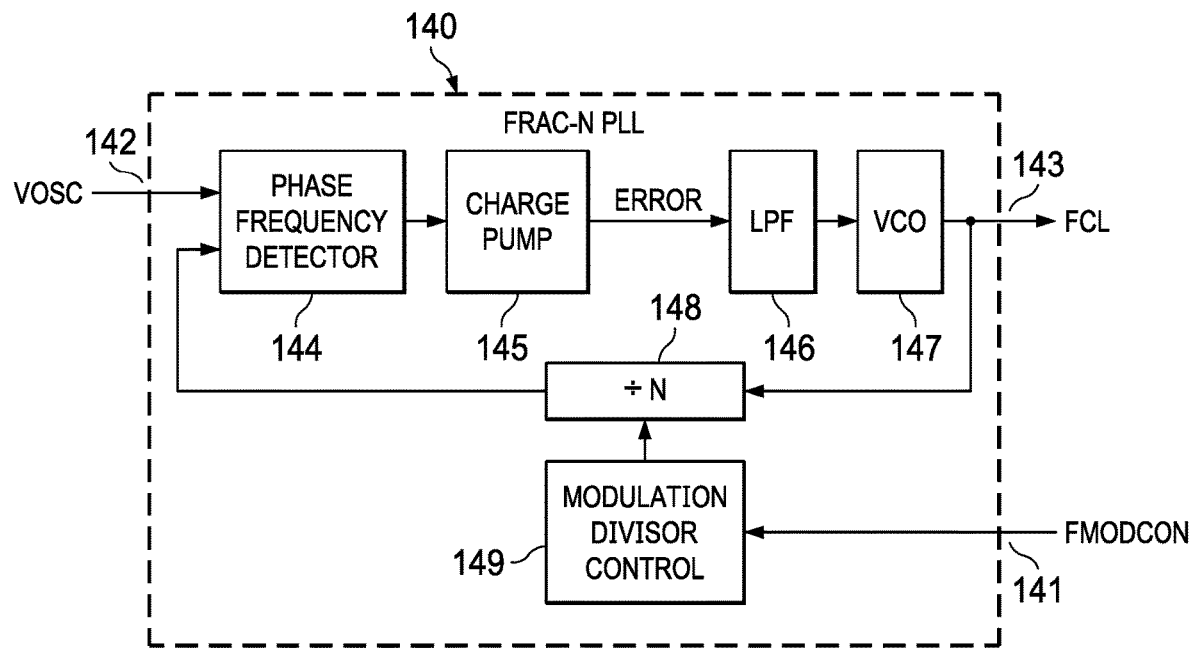
FIG. 1A is a schematic diagram of an example PLL circuit.
Figure 3:
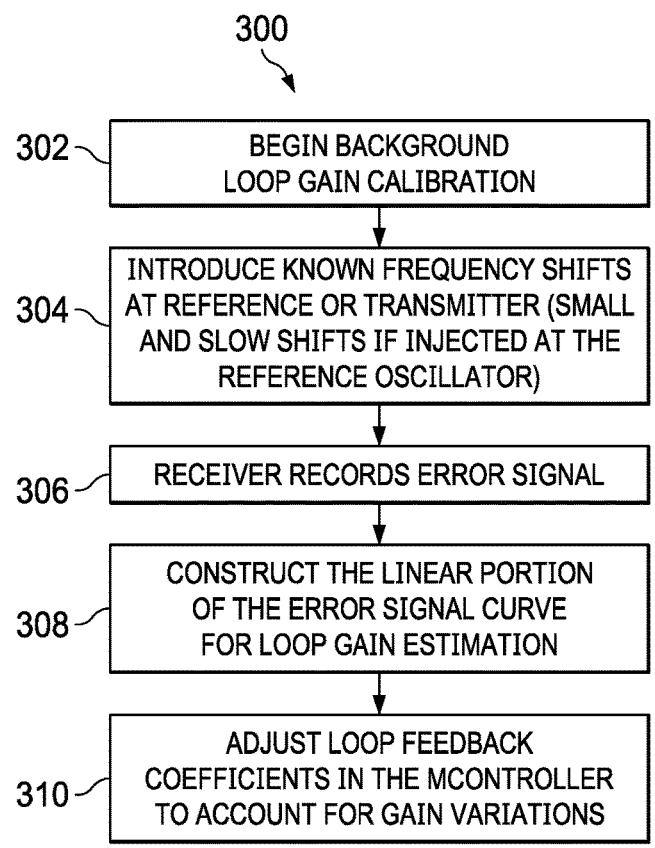
FIG. 3 is a flow diagram of a background loop gain calibration process example.

Referring initially to FIGS. 1 and 1A, FIG. 1 shows a clock system 100 with a molecular clock electronic device 101. FIG. 1A shows an example PLL circuit. The electronic device 101 includes a physics cell 102, a receiver 106, a transmitter 110, an oscillator control output terminal 111, an oscillator input terminal 112, and an output terminal 116. The electronic device 101 and the schematically illustrated circuitry thereof are or include internal circuit components, such as transistors, resistors, capacitors, programmed and/or programmable processing or logic circuits and components configured to implement the functions described herein.

The physics cell 102 has an input 103 and an output 104. The receiver 106 has an input 107 and an output 108. The input 107 of the receiver 106 is coupled to the output 104 of the physics cell 102. The transmitter 110 has a signal output 114 and a signal input 118. The system 100 includes a reference oscillator 120 having a control input 121 and a signal output 122. The control input 121 of the reference oscillator 120 is coupled to the oscillator control output terminal 111. The signal output 122 of the reference oscillator 120 is coupled to the oscillator input terminal 112.

The receiver 106 includes a low noise amplifier 124 (e.g., labeled "LNA"), a square-law detector 126 (e.g., labeled "$X^2$"), and a baseband amplifier 128 (e.g., labeled "BB"). An input of the low noise amplifier 124 is coupled to the input 107, and an output of the low noise amplifier 124 is coupled to an input of the square-law detector 126. An output of the square-law detector 126 is coupled to an input of the baseband amplifier 128. An output of the baseband amplifier 128 is coupled to the output 108 of the receiver 106. The receiver 106 as well as the low noise amplifier 124, square-law detector 126 and baseband amplifier 128 thereof receive a signal from the output 104 of the physics cell 102 and generate or otherwise provide an analog receiver output signal RXOUT at the output 108 responsive to and based at least partially on the signal from the physics cell 102.

The low noise amplifier 124, the square-law detector 126 and the baseband amplifier 128 are or include radio frequency (RF) circuitry. In one example, the low noise amplifier 124 operates around the molecular frequency (e.g., 120 GHz). In another example, the low noise amplifier 124 can be omitted, depending on the performance of the square-law detector 126. The square-law detector 126 in one example is a standard square-law detector that detects the power and amplitude of the incoming RF signal and performs amplitude demodulation. The input in one example is at 120 GHz, and the output of the square-law detector 126 is only the amplitude modulation. In one example, the multiplier 150 of the transmitter amplitude modulates the signal provided to the physics cell 102 at a modulation frequency for the molecular clock loop (e.g., 5 kHz or close to DC). The baseband amplifier 128 amplifies the signal from the square-law detector 126 for improved performance of the ADC 136. In another implementation, the baseband amplifier 128 is omitted, for example, depending on the performance of the ADC 136, which may include internal automatic gain control (AGC) circuitry.

The transmitter 110 includes a controller 130 (e.g., labeled "MICROCONTROLLER", an analog to digital converter 136 (e.g., labeled "ADC"), a PLL 140 (e.g., labeled "FRAC-N PLL"), a frequency multiplier 150 (e.g., labeled "×24"), a low pass filter 160 (e.g., labeled "LPF"), and an output clock circuit 170 (e.g., labeled "FOD OR PLL"). The controller 130, the PLL 140, and the frequency multiplier 150 of the transmitter 110 are coupled in a closed loop with the physics cell 102 and the receiver 106. The output clock circuit 170 provides an output clock signal FOUT having an output frequency.

The controller 130 has an input 131, a first control output 132, a reference control output 133, a second control output 134, and an output 135. The output 135 of the controller 130 is coupled to the receiver 106. The ADC 136 has an input and an output 138. In one example, the controller 130 provides one or more control signals to the receiver 106 via the output 135, for example, to calibrate the parameters of the receiver 106. For example, if there is a known drop in gain of the low noise amplifier 124, or the baseband amplifier 128 with respect to temperature, the controller 130 sends a digital signal to the receiver 106 via of the output 135 to control the gain to compensate for this gain loss, in response to the controller 130 determining that the temperature has drifted enough. In another example, the controller 130 performs automatic gain control by adjusting the gain of one or both of the amplifiers 124, 128 in response to converted values received at the controller input 131 from the output 138 of the ADC 136 are of a low amplitude to utilize more of the input range of the ADC 136.

Referring also to FIG. 1A, the PLL 140 has a control input 141, a reference input 142, and an output 143. The PLL 140 includes a phase frequency detector circuit 144 with a first input coupled to the reference input 142, a second input, and an output coupled to a charge pump 145. The output of the charge pump 145 is coupled to an analog low pass filter circuit 146 (e.g., labeled "LPF"). The charge pump generates an error signal ERROR at its output, and the low pass filter circuit 146 provides a filtered error signal to a voltage-controlled oscillator 147 (e.g., labeled "VCO"). The output of the voltage-controlled oscillator 147 is coupled to the PLL output 143. The VCO is configured to provide a closed loop frequency output signal FCL at the output 143. The PLL 140 also includes a divider circuit 148 (e.g., labeled "÷N") having an input coupled to the PLL output 143, as well as an output coupled to the second input of the phase frequency detector circuit 144, and a control input. The PLL 140 also includes a modulation divisor control circuit 149, such as a memory register, having an input coupled to the control input 141 of the PLL 140, and an output that sets or provides an integer divisor N to the divider circuit 148.

As further shown in FIG. 1, the frequency multiplier 150 has an input 152 coupled to the output 143 of the PLL 140, and an output coupled to the output 114 of the transmitter 110. The low pass filter 160 has an input 161 and an output 162. The output clock circuit 170 has a control input 171, a reference input 172, and an output 173. The reference input 142 of the PLL 140 is coupled to the oscillator input terminal 112, and the output 143 of the PLL 140 is coupled to the signal output 114 of the transmitter 110.

The input 161 of the low pass filter 160 is coupled to the second control output 134 of the controller 130. The output 162 of the low pass filter 160 is coupled to the control input 171 of the output clock circuit 170. In another implementation, the low pass filter 160 is omitted and the second control output 134 of the controller 130 is coupled directly to the control input 171 of the output clock circuit 170. The control input 171 of the output clock circuit 170 is coupled to the second control output 134 of the controller 130. The reference input 172 of the output clock circuit 170 is coupled to the oscillator input terminal 112. The output 173 of the output clock circuit 170 is coupled to the output terminal 116. The first control output 132 of the controller 130 is coupled to the control input 141 of the PLL 140.

The reference control output 133 of the controller 130 is coupled to the oscillator control output terminal 111. The controller 130 in one example provides a reference control signal REFCON at the reference control output 133 to control an oscillator operating parameter of the reference oscillator 120, such as temp, frequency, noise tuning, etc. In one example, the reference control signal REFCON is a digital signal, for example conveyed from the controller 130 as one or more command messages to the reference oscillator 120 by a digital control bus. In one implementation, the reference oscillator 120 includes heating elements for controlling the temperature of the oscillator circuitry and the reference control signal REFCON controls the oscillator temperature, for example, for use in temperature calibration operations as discussed further below. In this or another implementation, the reference control signal REFCON controls a noise-tuning parameter of the reference oscillator 120, for example, to control or enhance noise performance. In this or another implementation, the reference control signal REFCON sets or controls a coarse frequency adjustment feature of the reference oscillator 120, for example, to bring the frequency of the oscillator output signal close enough for molecular clock loop operation (e.g., within few ppm).

The reference oscillator 120 provides an oscillator output signal VOSC at the signal output 122. The oscillator output signal VOSC provides a frequency reference input to the reference input 142 of the PLL 140 and to the reference input 172 of the output clock circuit 170. In one example, the output clock circuit 170 is or includes a PLL. In another example, the output clock circuit 170 is or includes a fractional output divider (FOD) capable of frequency multiplication by fractional values in addition to integer values. The FOD in one example performs a fractional division by moving the edges of the output clock. PLLs will usually provide better noise performance than an FOD, since they control an actual oscillator that is continuously running, whereas an FOD merely position signal edges and may suffer from quantization noise. However, an FOD might be much lower in power consumption than a PLL, and different implementations can include either of these options for different forms of output clock circuitry in consideration of any associated trade-offs between power consumption and performance.

The controller 130 in one example is or includes programmable or programmed logic circuitry, such as a programmed processor, as well as analog and digital interface circuitry to generate analog and digital signals, and to receive analog and/or digital signals. The input 131 of the controller 130 is coupled to the ADC output 138. In operation, the controller 130 provides a first divisor value FMODCON at the first control output 132 to regulate the closed loop that includes the physics cell 102, the receiver 106, and the PLL 140 based on a signal RXOUT at the input 131 of the controller 130. The PLL 140 sets and internal divisor (e.g., via the modulation divisor control circuit 149 in FIG. 1A) to control the closed loop frequency output signal FCL. The frequency of the closed loop frequency output signal FCL is multiplied by the multiplier circuit 150, and the multiplier 150 provides an output signal to the input 103 of the physics cell 102.

In one example, the first divisor value FMODCON is a digital value representing an integer or fractional divisor value N. In one implementation, the controller 130 directly sends the value N in the signal FMODCON. In another implementation, the PLL 140 includes internal memory (not shown) that stores a set of divisor values (integer and/or fractional) in a look-up table and the controller 130 sends the signal FMODCON as a single control bit that controls the PLL 140 to advance to the next entry in the lookup table value. In another example, the first divisor value FMODCON is an encoded value that is decoded by the PLL 140 to set a divisor that controls the output frequency of the closed loop frequency output signal FCL. In another implementation, the first divisor value FMODCON is a pulse or single data bit that instructs the PLL 140 to increase or decrease the divisor value, or to select from a set of stored divisor values in the output clock circuit 170, to control the output frequency of the closed loop frequency output signal FCL.

In one implementation, the phase frequency detector 144 (FIG. 1A) of the PLL 140 compares the oscillator output signal VOSC to the feedback signal from the output of the divider circuit 148 and provides a directional up or down signal to the charge pump circuit 145. The charge pump 145 generates the error signal ERROR at its output, and the low pass filter circuit 146 provides a filtered error signal to drive the input of the voltage-controlled oscillator 147. The voltage-controlled oscillator provides the signal FCL with a frequency controlled by the first divisor value FMODCON from the controller 130. The output is fed through the divider circuit 148 to provide a frequency divided feedback signal to the second input of the phase frequency detector 144. In operation, the error signal ERROR increases or decreases if the output phase drifts and the negative feedback loop of the PLL drives the voltage-controlled oscillator 147 to reduce the error and the output phase locks in steady state. In one example, the PLL 140 is an integer-N PLL and the frequency of the closed loop frequency output signal FCL is a rational multiple of the reference frequency of the oscillator output signal VOSC. In another example, the PLL 140 is a fractional N (FRAC-N) PLL.

The controller 130 provides a second divisor value FOCON at the second control output 134 based on the signal at the input 131 of the controller 130 to control (e.g., regulate) the output frequency of the output clock signal FOUT generated by the output clock circuit 170. In one example, the second divisor value FOCON is a digital value representing an integer divisor value. In another example, the second divisor value FOCON is an encoded value that is decoded by the output clock circuit 170 to set a divisor that controls the output frequency of the output clock signal FOUT. In another implementation, the second divisor value FOCON is a pulse or single data bit that instructs the output clock circuit 170 to increase or decrease the divisor value, or to select from a set of stored divisor values in the output clock circuit 170, to control the output frequency of the output clock signal FOUT.

As previously discussed, the low pass filter 160 is included in one implementation and provides digital low pass filtering of the second divisor values FOCON provided by the controller 130 at the second control output 134. In another implementation, the low pass filter 160 is omitted, and the second control output 134 is connected directly to the control input 171 of the output clock circuit 170. In one implementation, the output clock circuit 170 is a PLL, such as an integer N PLL or a fractional N PLL, for example, as described above in connection with FIG. 1A. In operation, the controller 130 controls the PLL 140 and the output clock circuit 170 by changing their integer or fractional divisors "N" via the respective signals FMODCON and FOCON. The low pass filter is a digital low-pass filter. As the reference oscillator 120 starts to drift due to temperature or aging, the loop including the PLL 140, the multiplier 150, the physics cell 102, the receiver 106, the ADC 136 and the controller 130 detects a frequency shift in the molecular clock operation based on the signal at the input 131 of the controller 130. In response, in steady state operation, the controller 130 applies the second divisor value FOCON at the output 134 to adjust the divisor of the output clock circuit 170 to compensate for the drift in the oscillator output signal VOSC and maintain the frequency of the frequency output signal FOUT at a fixed or generally constant value.

The low-pass filter 160 limits the bandwidth of the digital correction signal and mitigates or avoids perturbing the output phase noise at higher offsets. In one implementation, the low-pass filter 160 implements decimation, for example, where the molecular clock loop is running at a sample rate of 10,000 frequency measurements per second, and the controller 130 generates 10,000 corresponding correction signals in the form of the second divisor values FOCON per second. In this example, the second divisor values FOCON may be limited to a small number of bits, leading to large quantization noise. In operation, the low-pass filter 160 in one example averages a number of the second divisor values FOCON, such as 1000 samples, and produces a small number of samples at the output 162 of the low-pass filter (e.g., 10 values per second). The divisor of the output clock circuit 170 is set by the 10 samples per second, which can be of a much finer resolution than the second divisor values FOCON from the output 134 of the controller 130, and the use of the low-pass filter 160 reduces quantization noise and mitigates or avoids contamination of the output spectrum of the output clock circuit 170. In one example, the inclusion of the low-pass filter 160 provides an extra degree of freedom with separate control for the molecular clock loop bandwidth, and the output clock circuit 170. The reference oscillator 120 provides the oscillator output signal VOSC as a frequency reference input to the reference input 172 of the output clock circuit 170.

The controller 130 provides the second divisor values FOCON to control the output frequency of the output clock signal FOUT in first and second modes in the illustrated example. The controller 130 operates in a first mode for steady state operation and performs calibration operations in a second mode with perturbations of the closed loop that includes the transmitter 110, the physics cell 102, the receiver 106, and the PLL 140. The controller 130 creates perturbations in the closed loop that includes the physics cell 102, the receiver 106, the transmitter 110 and the PLL 140 by adjusting or shifting the first divisor value FMODCON. The controller 130 monitors the receiver output signal RXOUT from the receiver output 108 in the form of digital values converted by the ADC 136 and received at the input 131 of the controller 130. The controller 130 in various implementations assesses the closed loop response, which includes the response of the physics cell 102, to the applied perturbations. In normal study state operation in the first mode, the controller 130 implements output frequency regulation based on the signals received at the input 131 to try to maintain the frequency of the frequency output signal FOUT constant.

In the second mode, the controller 130 performs one or more calibration operations, including applying perturbations to the closed loop by adjusting or shifting the first divisor value FMODCON, referred to herein as shifts or shifting. The controller 130 measures the response of the physics cell and the other components of the closed loop based on the signal received at the input 131. In addition, the controller 130 separately shifts the second divisor value FOCON to mitigate or avoid interruptions in the constant frequency of the frequency output signal FOUT in the opposite direction during such perturbation/measurement calibration operations in the second mode. In one implementation, the respective first and second divisor values FMODCON and FOCON are substantially equal during steady state operation. In another implementation, the divisor values FMODCON and FOCON are not equal during steady state operation in the first mode, and either or both of these values may vary slightly under control of the controller 130.

In the second mode, the controller 130 shifts the first divisor value FMODCON in a first direction to cause a perturbation in the closed loop, and concurrently shifts the second divisor value FOCON in an opposite second direction to counteract a response of the closed loop to the perturbation and to regulate the output frequency of the output clock signal FOUT. The controller 130 analyzes the response of the closed loop to the perturbation based on the signal at the input 131 of the controller 130. The configuration of the PLL 140 within the closed loop and the output clock circuit 170 outside the closed loop enables the controller 130 to perform various operations such as calibration during normal operation without disturbing the frequency of the output clock signal FOUT. This configuration and operation of the controller 130, moreover, allows calibration for temperature, aging, and other effects on the signal channel that could not be addressed in molecular clock systems in which the output frequency was generated within the closed loop.

In one implementation, the controller shifts the first divisor value FMODCON by a first amount in the first direction to cause the perturbation in the closed loop and shifts the second divisor value FOCON by the first amount in the opposite second direction to counteract the response of the closed loop to the perturbation and to regulate the output frequency of the output clock signal FOUT. In another implementation, the controller 130 shifts the respective first and second divisor values FMODCON and FOCON in opposite directions by different amounts.

In one example, the controller 130 causes a single pulse type perturbation in the closed loop circuitry by shifting the respective first and second divisor values FMODCON and FOCON, and then shifts the respective first and second divisor values FMODCON and FOCON back to their starting values. In other examples, the controller 130 applies a perturbation by concurrently shifting the respective first and second divisor values FMODCON and FOCON in opposite directions in steps, or by ramps, or sweeps, or other forms of value shifting or combinations thereof, for example, to perform a frequency shift in the transmitter output. In one implementation, the controller 130 performs one or more calibration operations including applying perturbations and associated analysis of the responsive signal received at the controller input 131.

The controller 130 analyzes the received signal to determine a divisor value and corresponding frequency at or near a local minima of an absorption parameter of the physics cell 102. The controller operation in the first and second modes facilitates use of a reference oscillator 120 and the electronic device 101 as a clock source that is corrected by the molecular clock configuration with the physics cell 102 in a closed loop. The illustrated circuit configuration and controller operation also facilitate calibration capabilities to accommodate ageing, temperature variations and other error sources while maintaining ultra-stable frequency of the output clock signal FOUT (e.g., sub-parts per billion or sub-ppb).

Figure 2:
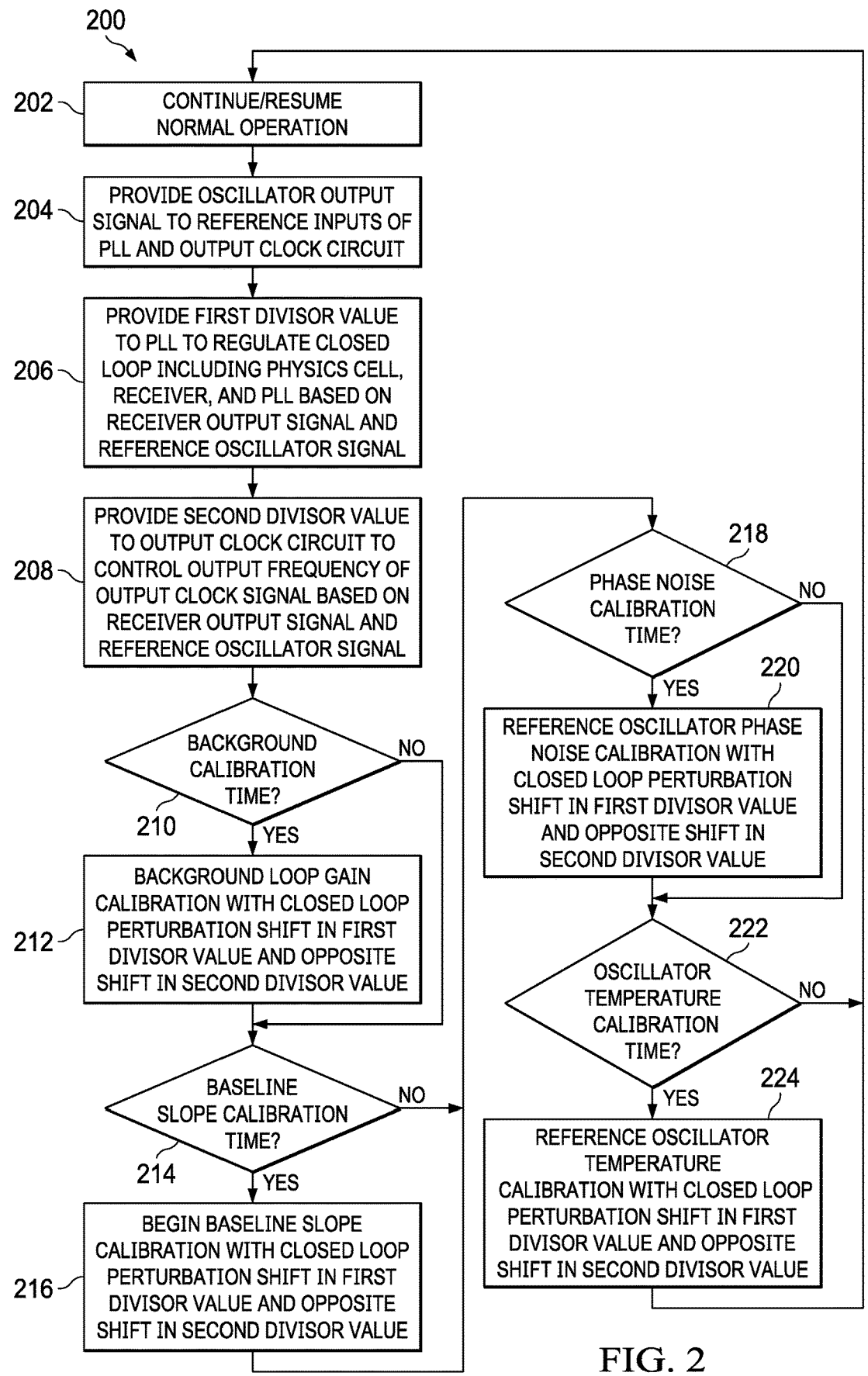
FIG. 2 shows a flow diagram of a method.

FIG. 2 shows a flow diagram of a method 200. The method is described below in reference to operation of the controller 130 in the electronic device 101 and system 100 of FIGS. 1 and 1A. In one example, the controller 130 implements the method 200 by a processor of the controller 130 executing program instructions stored in the controller 130 or in an electronic memory operatively coupled to the controller 130. The method 200 begins at 202 in FIG. 2 with continuation or resumption of normal operation in the first mode. At 204, the reference oscillator 120 provides the oscillator output signal VOSC to the reference inputs 142 and 172 of the PLL 140 and the output clock circuit 170, respectively. At 206, the controller 130 provides the first divisor value FMODCON to the control input 141 of the PLL 140 to regulate the closed loop that includes the physics cell 102, the receiver 106, and the PLL 140 based on the receiver output signal RXOUT. At 208, the controller 130 provides the second divisor value FOCON to the control input 171 of the output clock circuit 170 to control the output frequency of the output clock signal FOUT.

The method 200 also includes operation in the second mode for performing one or more calibration operations. The controller 130 determines that 210 whether it is time for a background calibration. If not (NO at 210), the method proceeds to 214 in FIG. 2 as discussed further below. If so (YES at 210), the controller 130 performs a background loop gain calibration at 212 with a closed loop perturbation shift in the first divisor value FMODCON and an opposite shift in the second divisor value FOCON. In one implementation, the controller 130 shifts the first divisor value FMODCON in a first direction at 212 to cause a perturbation in the closed loop and shifts the second divisor value FOCON in an opposite second direction at 212 to counteract a response of the closed loop to the perturbation and to regulate the output frequency of the output clock signal FOUT. In addition, the controller 130 analyzes the response of the closed loop to the perturbation based on the receiver output signal RXOUT. Further details of one example background loop gain calibration operation at 212 are illustrated and described below in connection with FIGS. 3-7.

At 214 in FIG. 2, the controller 130 determines whether it is time for a baseline slope calibration. If not (NO at 214), the method 200 proceeds to 218 as discussed further below. If so (YES at 214), the controller 130 begins the baseline slope calibration at 216 with closed loop perturbation shift in the first divisor value FMODCON and an opposite shift in the second divisor value FOCON. In one implementation, the controller 130 shifts the first divisor value FMODCON in a first direction at 216 to cause a perturbation in the closed loop and shifts the second divisor value FOCON in an opposite second direction at 216 to counteract a response of the closed loop to the perturbation and to regulate the output frequency of the output clock signal FOUT. In addition, the controller 130 analyzes the response of the closed loop to the perturbation based on the receiver output signal RXOUT. Further details of one example baseline slope calibration operation at 216 are illustrated and described below in connection with FIGS. 8-11.

At 218, the controller 130 determines whether it is time for a phase noise calibration. If not (NO at 218), the method 200 proceeds to 222 as discussed further below. If so (YES at 218), the controller 130 begins the phase noise calibration at 220 with closed loop perturbation shift in the first divisor value FMODCON and an opposite shift in the second divisor value FOCON. In one implementation, the controller 130 shifts the first divisor value FMODCON in a first direction at 220 to cause a perturbation in the closed loop and shifts the second divisor value FOCON in an opposite second direction at 220 to counteract a response of the closed loop to the perturbation and to regulate the output frequency of the output clock signal FOUT. In addition, the controller 130 analyzes the response of the closed loop to the perturbation based on the receiver output signal RXOUT. Further details of one example phase noise calibration operation at 220 are illustrated and described below in connection with FIGS. 12-14.

The method 200 continues at 222, where the controller 130 determines whether it is time for an oscillator temperature calibration. If not (NO at 222), the method 200 returns to resume normal operation at 202 in FIG. 2 above. If so (YES at 222), the controller 130 begins the oscillator temperature calibration at 224 with closed loop perturbation shift in the first divisor value FMODCON and an opposite shift in the second divisor value FOCON. In one implementation, the controller 130 shifts the first divisor value FMODCON in a first direction at 224 to cause a perturbation in the closed loop and shifts the second divisor value FOCON in an opposite second direction at 224 to counteract a response of the closed loop to the perturbation and to regulate the output frequency of the output clock signal FOUT. In addition, the controller 130 analyzes the response of the closed loop to the perturbation based on the receiver output signal RXOUT. Further details of one example oscillator temperature calibration operation at 220 are illustrated and described below in connection with FIGS. 15-18. Following reference oscillator temperature calibration at 224, the method 200 resumes normal operation at 202 in FIG. 2.

In the example controller 130 implements the calibration shifting at 212, 216, 220, and/or 224 by shifting the first divisor value FMODCON by a first amount in the first direction to cause the perturbation in the closed loop, and shifting the second divisor value FOCON by the first amount in the opposite second direction to counteract the response of the closed loop to the perturbation and to regulate the output frequency of the output clock signal FOUT.

Referring now to FIGS. 3-7, FIG. 3 is a flow diagram of a background loop gain calibration process 300 in one example of the background loop gain calibration processing at 212 in FIG. 2 above. The background loop gain calibration begins at 302, and the controller 130 introduces known frequency shifts at 304, for example, by shifting the first divisor value FMODCON in a first direction at 304 to cause a perturbation in the closed loop and shifting the second divisor value FOCON in an opposite second direction at 304 to counteract a response of the closed loop to the perturbation and to regulate the output frequency of the output clock signal FOUT. In another implementation, the controller 130 adjusts the REFCON signal at the output 133 to introduce small and slow shifts in the course frequency control of the reference oscillator 120 while concurrently providing opposite direction adjustments in the first and second divisor values FMODCON and FOCON, respectively.

At 306, the receiver 106 records an error signal, which is demodulated by the receiver circuitry 106 and converted by the ADC 136 to provide a signal at the input 131 of the controller 130. The controller constructs a linear portion of the error signal curve at 308 in FIG. 3 for loop gain estimation. At 310, the controller 130 adjust the loop feedback coefficients to account for any gain variations, for example, by adjusting loop feedback coefficients in a memory of the controller 130.

Figure 4:
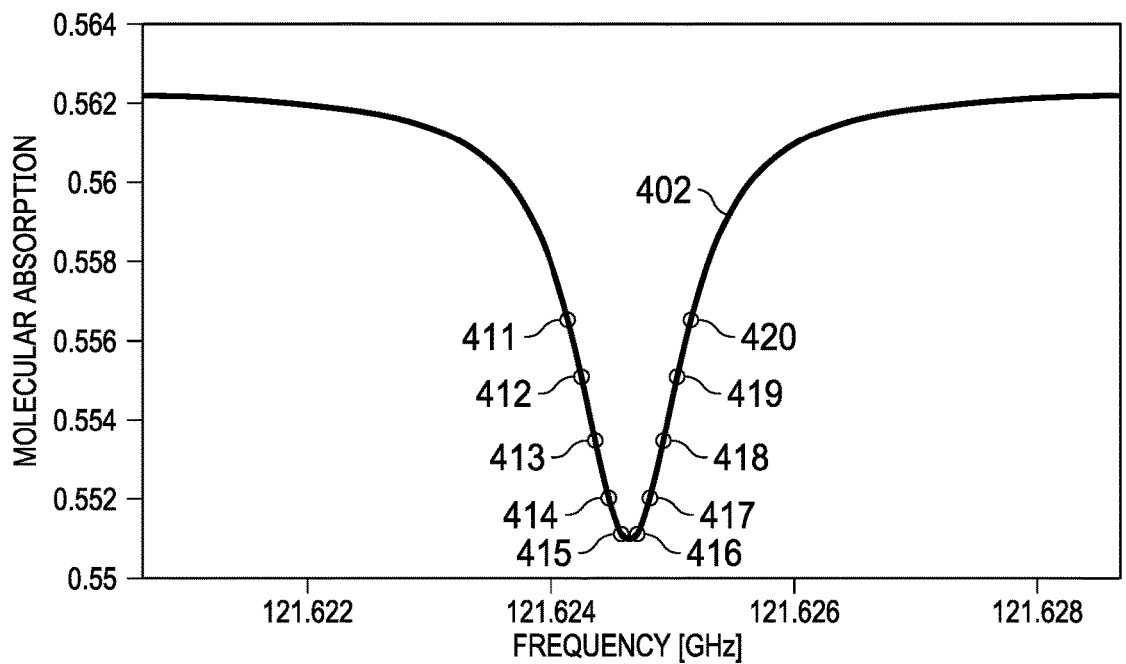
FIG. 4 is a graph of molecular absorption as a function of frequency for a physics cell.

FIG. 4 shows a graph 400 of molecular absorption as a function of frequency for a physics cell. The graph 400 shows a curve 402 that represents molecular absorption as a function of frequency. The curve 502 extends both below and above a local minimum associated with an optimum or preferred operating point according to the specifics of the physics cell 102 in FIG. 1. The graph 400 also shows data points 411-420 that represent the absorption value obtained and demodulated by the receiver 106 and converted by the ADC 136. The controller 130 in one example performs a first sweep with stepwise increasing values of the first divisor value FMODCON in a first direction that increases the closed loop frequency in a first direction from below an expected local minima in the curve 402 and continues past the expected local minima to cause a perturbation in the closed loop. The controller 130 concurrently shifts the second divisor value FOCON at 304 with stepwise decreasing values in an opposite second direction. In this example, the controller 130 then performs a reverse sweep to step the closed loop frequency down with decreasing first divisor values FMODCON while stepwise increasing the second divisor values FOCON. The controller 130 obtains responsive readings from the input 131 that represent converted amplitudes with respect to the molecular absorption of the physics cell 102, and the controller evaluates the resulting absorption data points 411-420 shown in FIG. 4. From this data, the controller 130 analyzes the relative amplitudes and identifies first and second divisor values that correspond with a local minima of the curve 402, for example, using curve fitting processing, linear interpolation techniques, etc.

Figure 5:
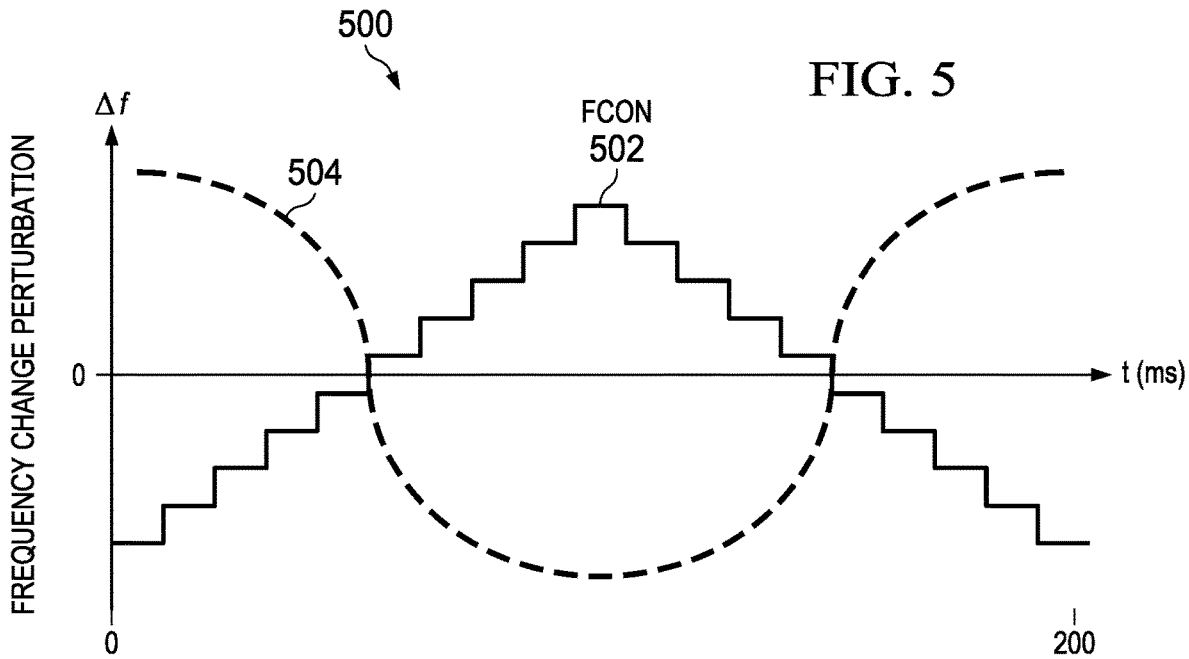
FIG. 5 is a graph of stepped frequency perturbations in a loop gain calibration.
Figure 6:
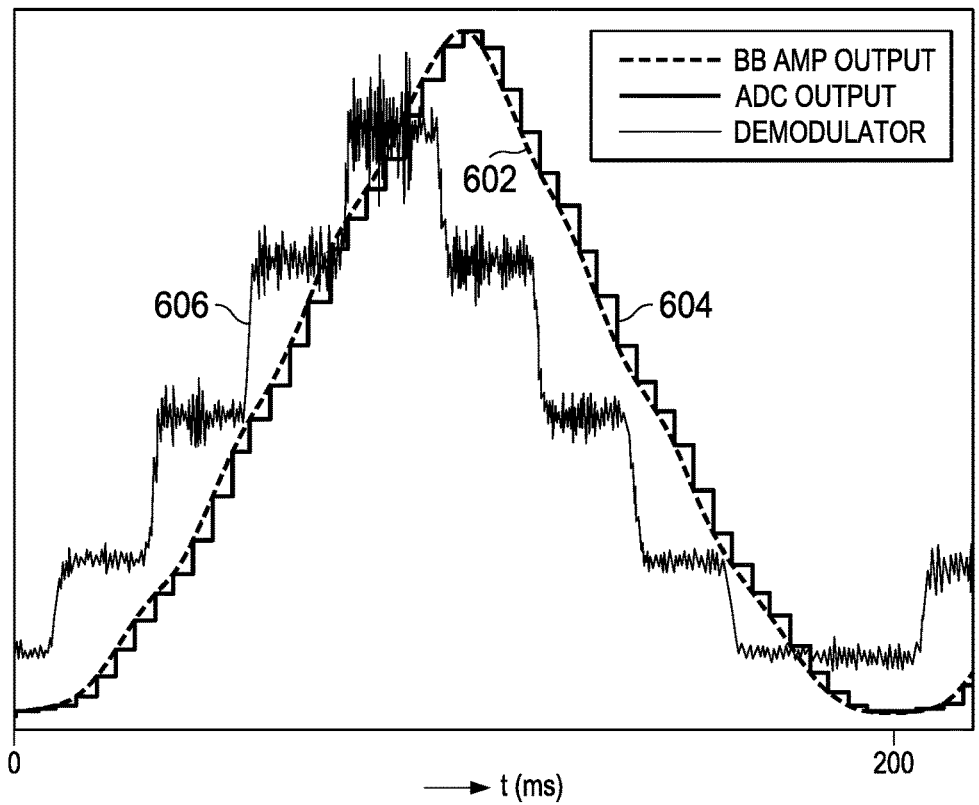
FIG. 6 is a graph of closed loop receiver response to the perturbation in the loop gain calibration.
Figure 7:
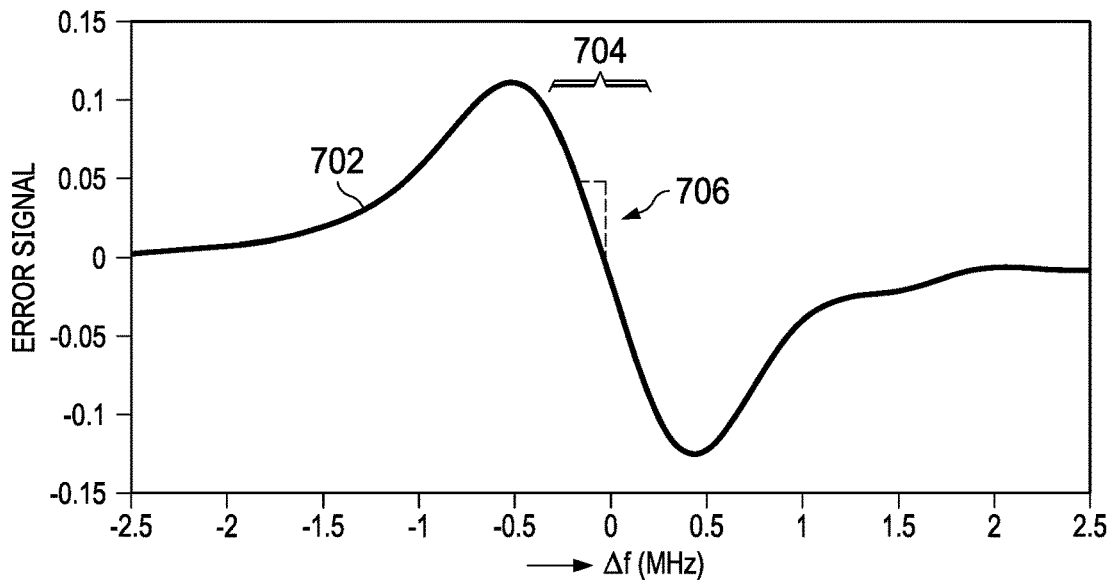
FIG. 7 is a graph of error signal as a function of frequency shift in the loop gain calibration.
Figure 8:
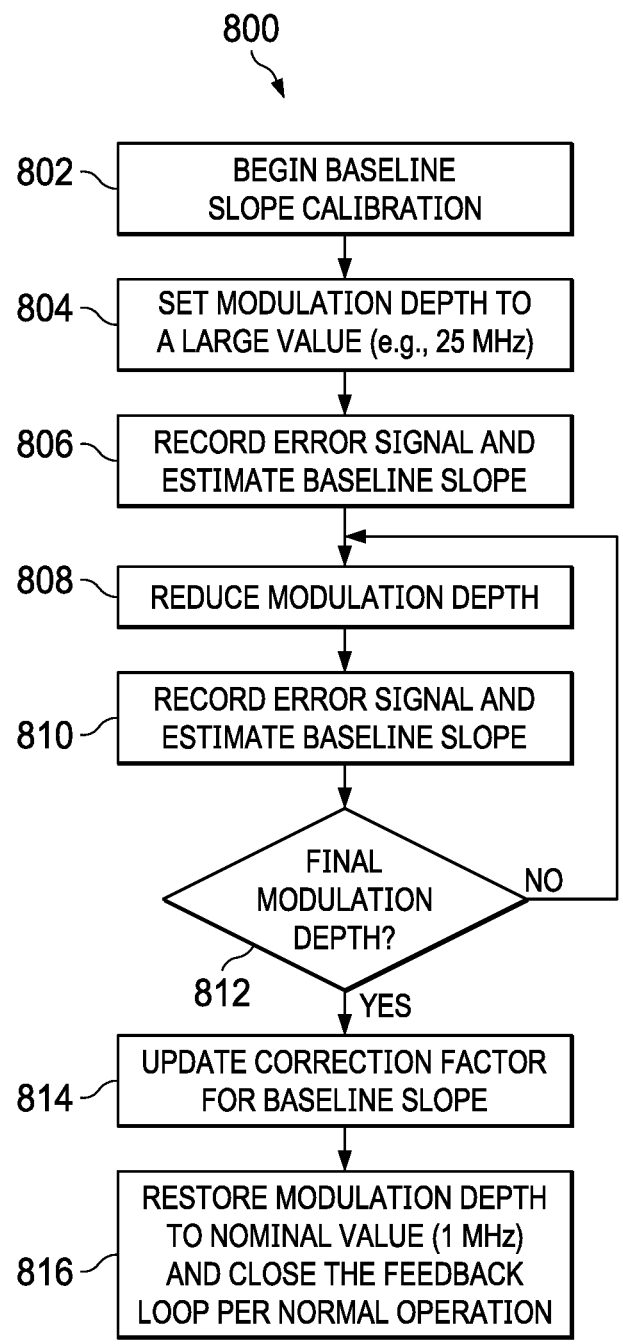
FIG. 8 is a flow diagram of a baseline slope calibration process example.

FIG. 5 shows a graph 500 with a curve 502 showing stepped frequency perturbations in an example loop gain calibration. The graph 500 also shows an example physics cell absorption curve 504 to illustrate the change in absorption in response to the stepped frequency perturbations upwards and then downwards, with a local minima. FIG. 6 shows a graph 600 with curves 602, 604, and 606 of closed loop receiver signals showing the physics cell response to the perturbation in the loop gain calibration. The curve 602 shows the signal output by the baseband amplifier 128 in FIG. 1 and the curve 604 shows the converted values provided to the input 131 of the controller 130 by the ADC 136. The curve 606 shows the signal at the input 107 of the receiver 106 prior to demodulation. FIG. 7 shows a graph 700 of error signal as a function of frequency shift in the loop gain calibration. A curve 702 in FIG. 7 shows the error signal determined by the controller 130 as a function of frequency change (e.g., labeled "Δf" along the horizontal axis), and the curves 702 illustrates a generally linear region 704. The controller 130 obtains sample values from the input 131 in response to the applied perturbation of the closed-loop and determines error signal values and respective frequency change values. The controller 130 constructs the linear portion 704 (e.g., at 308 in FIG. 3 above), and determines a loop gain slope 706 in FIG. 7 (e.g., at 310 in FIG. 3).

Figure 9:
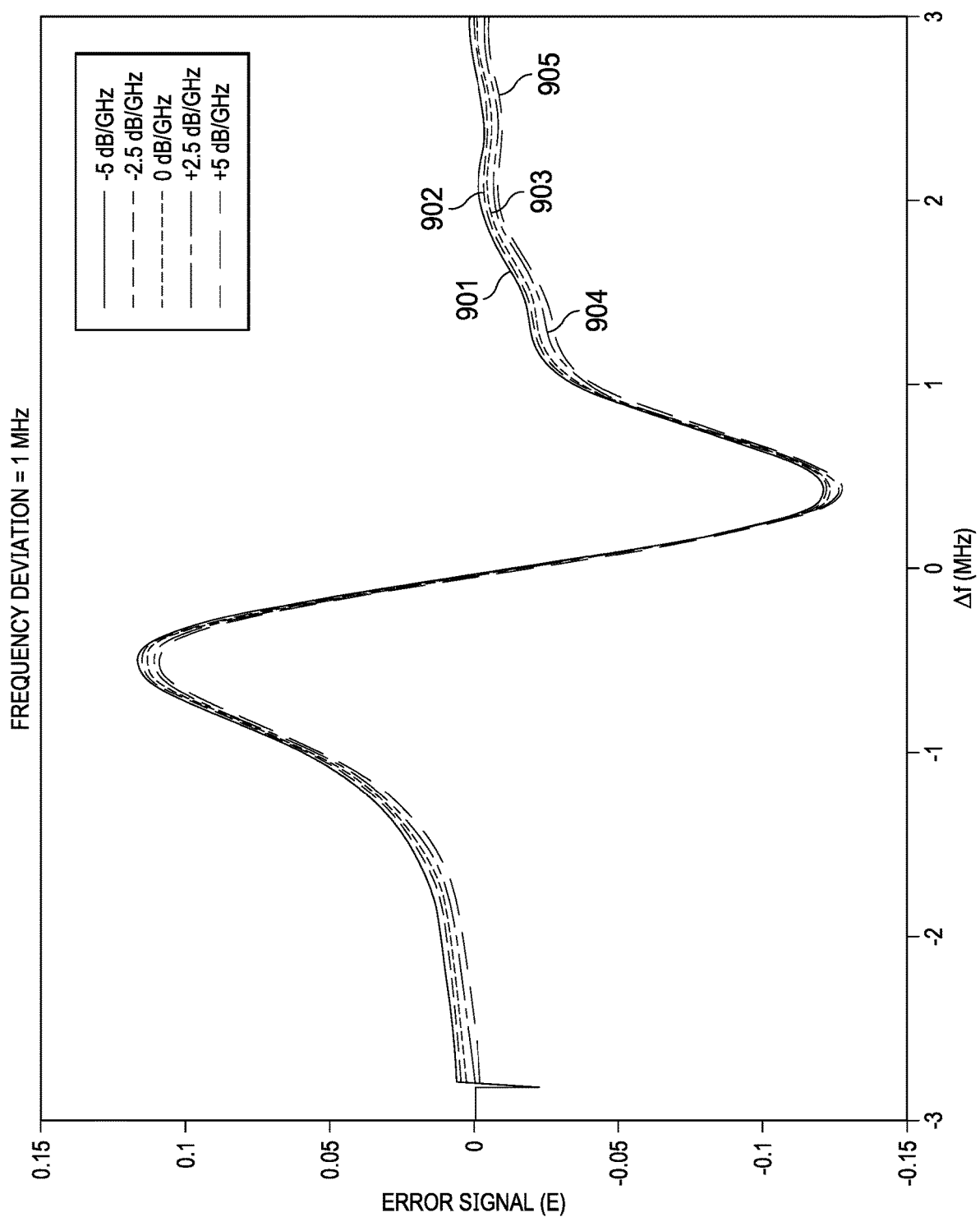

Referring now to FIGS. 8-11, FIG. 8 shows an example baseline slope calibration method 800 implemented in one example by the controller 130 (e.g., at 216 in FIG. 2), and FIGS. 9-11 illustrate frequency deviation graphs as a function of frequency for progressively larger modulation depths in the baseline slope calibration method 800. The controller 130 in one example modulates the closed loop operating frequency during the calibration method 800 by shifting the first divisor value FMODCON in a first direction to perturb the closed loop while concurrently shifting the second divisor value FOCON in an opposite second direction. The controller 130 begins the baseline slope calibration at 802 in FIG. 8 (e.g., YES at 214 in FIG. 2) and the controller 130 sets a modulation depth (e.g., frequency deviation Δf) to a large value at 804 (e.g., 25 MHz). In the method 800, the controller 130 modulates the closed-loop frequency by shifting the first divisor value FMODCON in a first direction by half the modulation depth and concurrently shifting the second divisor value FOCON in an opposite second direction; then shifting the first divisor value FMODCON in the first direction by the modulation depth and concurrently shifting the second divisor value FOCON the first direction; and then shifting the first divisor value FMODCON in the first direction by half the modulation depth and concurrently shifting the second divisor value FOCON back in the second direction.

The controller 130 uses the large modulation depth applied at 804 and a responsive error signal recorded at 806 based on the signal at the input 131. With this, the controller 130 obtains information about a baseline slope BL_slope by computing or estimating an error $E = S\_fxo * \Delta f\_xo + S\_BL * BL\_slope$, where $S\_fxo$ is a reference sensitivity of the reference oscillator 120, $\Delta f\_xo$ is a reference frequency drift value, and $S\_BL$ is a baseline sensitivity.

The controller 130 uses different modulation depth values to generate equations and estimate $\Delta f\_xo$. At 806, the controller 130 records an error signal responsive to the large modulation depth value applied at 804 and estimates the baseline slope based on the converted signal at the input 131. At 808, the controller 130 reduces the modulation depth, and records a corresponding error signal and estimates the baseline slope at 810 responsive to the reduced modulation depth perturbation applied at 808. The controller 130 determines whether a final modulation depth has been reached at 812. If not (NO at 812), the controller returns to again reduce the modulation depth and record a corresponding error signal at 808 and 810. In practice, the controller 130 makes perturbations and corresponding measurements at two or more modulation depths.

Once the final modulation depth has been reached (YES at 812), the controller updates a correction factor for the baseline slope at 814, for example, by storing an updated factor and a memory of the controller 130. The controller 130 restores the modulation depth to a nominal value (e.g., 1 MHz) and closes the feedback loop for normal operation at 816 to complete the baseline slope calibration method 800. As discussed above in connection with FIG. 2, the controller 130 implements the baseline slope calibration and other calibration processes at different times, for example, based on timers maintained by the controller 130. In one implementation, the controller 130 repeats the baseline slope calibration method 800 often depending on a thermal time constant of the system to facilitate overall stability.

FIGS. 9-11 illustrate respective graphs 900, 1000, and 1100 with curves representing error signal amplitude E for different slope gain values as a function of frequency change for different modulation depths, based on the signal at the 131 of the controller 130. The examples of FIGS. 9-11 show an example having a baseline sensitivity of 7.29 mV/(dB/GHz) and a reference shift sensitivity of −8.35 mV/MHZ for an example nominal modulation depth of 1 MHz, a baseline sensitivity of 72.9 mV/(dB/GHz) and a reference shift sensitivity of −0.687 mV/MHZ for a modulation depth of 10 MHz, and a baseline sensitivity of 180 mV/(dB/GHz) and a reference shift sensitivity of −0.0475 mV/MHZ for a modulation depth of 25 MHz. The graph 900 and FIG. 9 shows curves 901-905 for the example nominal modulation depth of 1 MHz (e.g., perturbation of +/−0.5 MHz in the illustrated example). The curve 901 shows the error signal response for a gain of −5 dB/GHz; the curve 902 shows the error signal response for a gain of −2.5 dB/GHz; the curve 903 shows the error signal response for a gain of 0 dB/GHz; the curve 904 shows the error signal response for a gain of +2.5 dB/GHz; and the curve 905 shows the error signal response for a gain of +5 dB/GHz.

The graph 1000 and FIG. 10 shows curves 1001-1005 for a larger modulation depth of 10 MHz (e.g., perturbation of +/−0.5 MHz in the illustrated example). The curve 1001 shows the error signal response for a gain of −5 dB/GHz; the curve 1002 shows the error signal response for a gain of −2.5 dB/GHz; the curve 1003 shows the error signal response for a gain of 0 dB/GHz; the curve 1004 shows the error signal response for a gain of +2.5 dB/GHz; and the curve 1005 shows the error signal response for a gain of +5 dB/GHz. The graph 1100 and FIG. 11 shows curves 1101-1105 for a larger modulation depth of 25 MHz (e.g., perturbation of +/−0.5 MHz in the illustrated example). The curve 1101 shows the error signal response for a gain of −5 dB/GHz; the curve 1102 shows the error signal response for a gain of −2.5 dB/GHz; the curve 1103 shows the error signal response for a gain of 0 dB/GHz; the curve 1104 shows the error signal response for a gain of +2.5 dB/GHz; and the curve 1105 shows the error signal response for a gain of +5 dB/GHz. In one example implementation of the calibration method 800, the controller 130 initially sets the modulation depth to 25 MHz and 804 in FIG. 8, and then reduces the modulation depth to 10 MHz at 808, and then subsequently restores the modulation depth to nominal value 1 MHz at 816 for resuming normal operation at 202 in FIG. 2.

Figure 12:
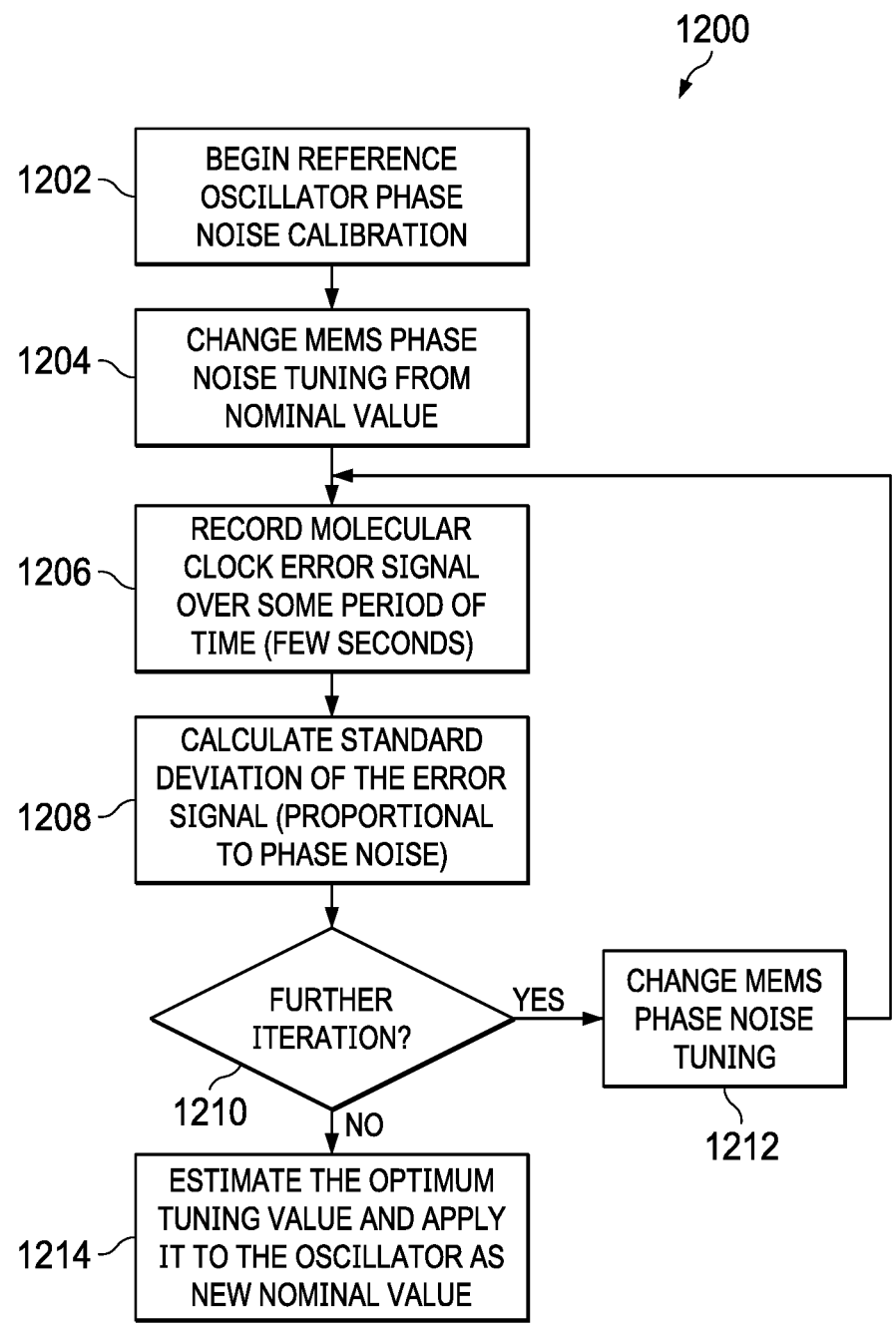
FIG. 12 is a flow diagram of a reference oscillator phase noise calibration process example.
Figure 13:
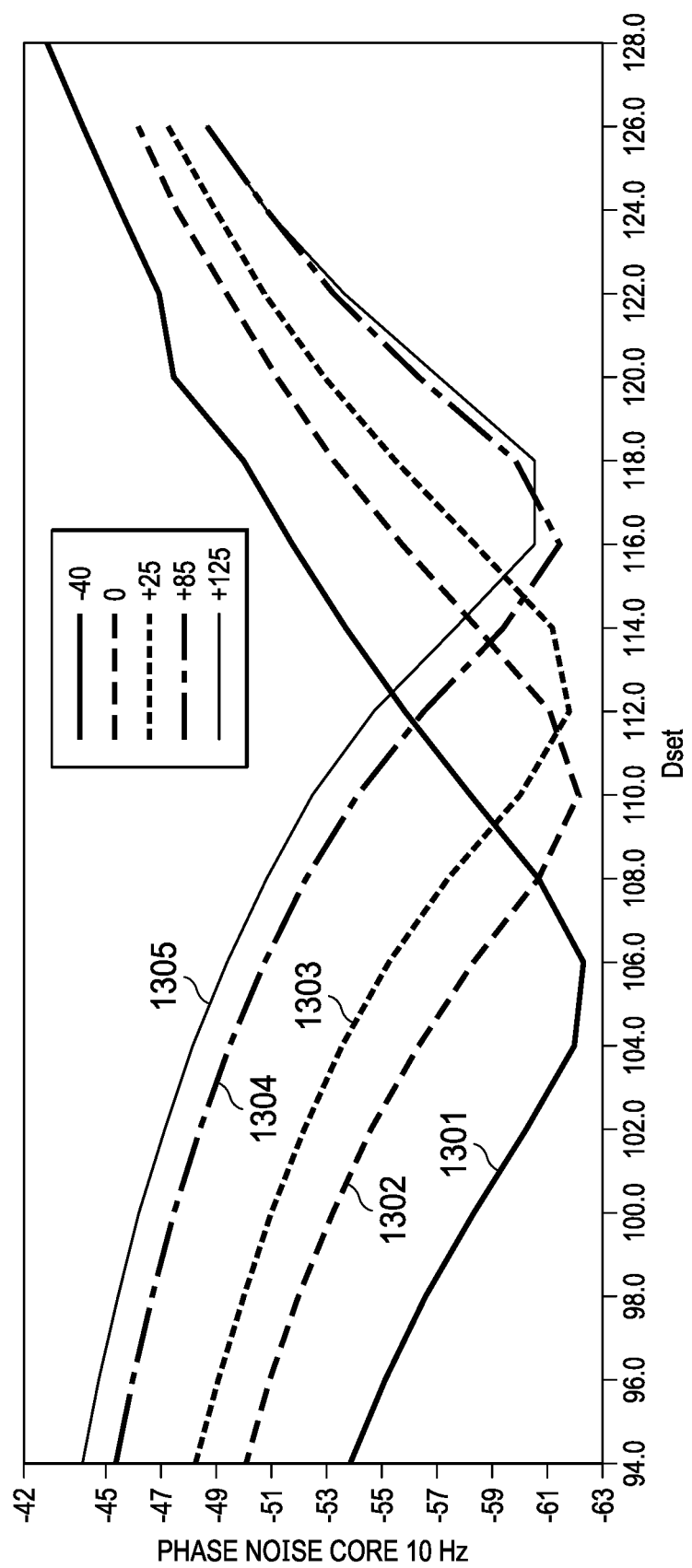
FIG. 13 is a graph of reference oscillator phase noise as a function of a tuning parameter.
Figure 14:
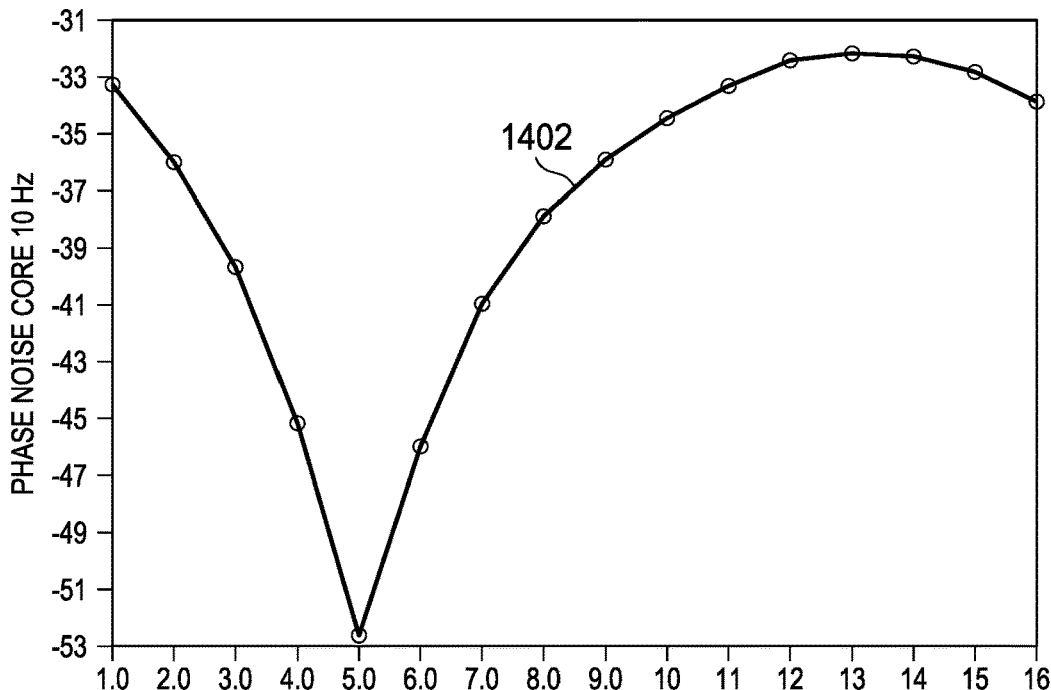
FIG. 14 is another graph of reference oscillator phase noise as a function of a tuning parameter.
Figure 15:
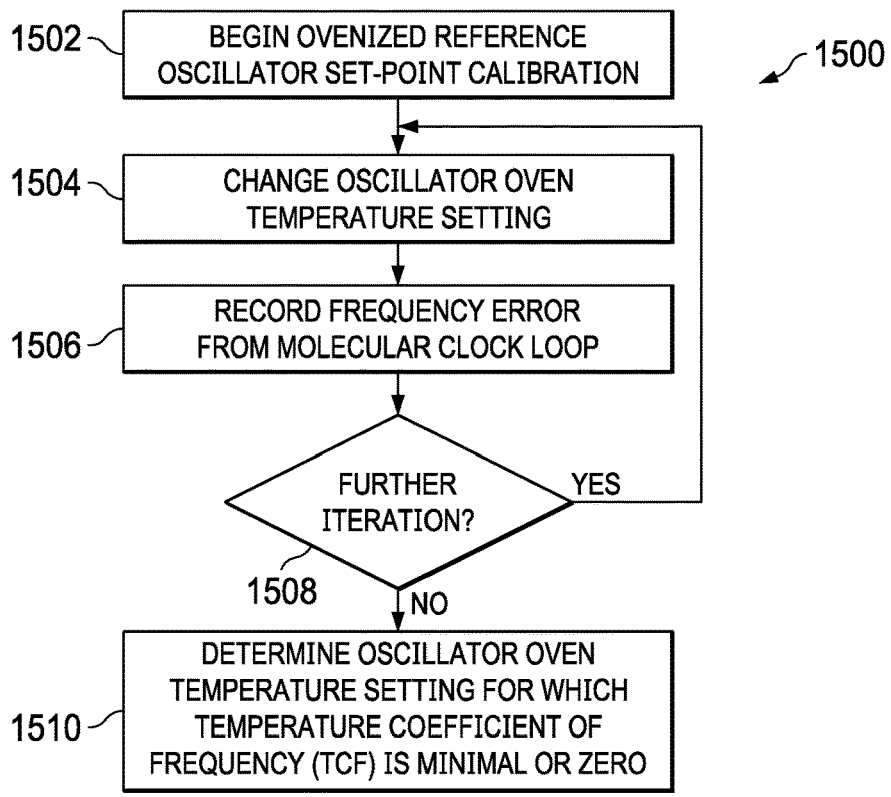
FIG. 15 is a flow diagram of an oscillator temperature calibration example.

Referring now to FIGS. 12-14, FIG. 12 shows an example reference oscillator phase noise calibration process 1200, for example, implemented by the controller 130 at 220 in FIG. 2. FIG. 13 shows a graph 1300 of reference oscillator phase noise as a function of a tuning parameter and FIG. 14 shows a graph 1400 of reference oscillator phase noise as a function of a tuning parameter. In one implementation, the controller 130 selectively changes a tuning parameter of the reference oscillator 120 by the reference control signal REFCON at the output 133 to implement the reference oscillator phase noise calibration process 1200. The process 1200 is illustrated in the context of a micro-electromechanical system (MEMS) reference oscillator 120, and the process 1200 begins at 1202. At 1204, the controller 130 changes the reference oscillator noise tuning from a nominal value, for example, based on the reference control signal REFCON at the output 133. At 1206, the controller 130 records the molecular clock error signal over a period of time, such as a few seconds.

At 1208, the controller 130 calculates a standard deviation of the error signal, which is proportional to phase noise of the reference oscillator. The controller 130 determines at 1210 whether a further iteration is desired. If not (NO at 12 time), the controller 130 estimates the optimum tuning value and applies it to the reference oscillator 120 as a new nominal value at 1214. If a further iteration is desired (YES at 12 time), the controller 130 changes the phase noise tuning parameter at 1200 time, and the process 1200 returns to 1206 as previously discussed. Once the reference oscillator phase noise calibration process 1200 is completed, the controller 130 resumes normal operation at 202 in FIG. 2 above. The graph 1300 and FIG. 13 shows several curves 1301-1305 of phase noise as a function of a digital setting value (labeled "Dset") for different tuning parameters. The curve 1301 shows the phase noise for a tuning parameter value of −40; the curve 1302 shows the phase noise for a tuning parameter of 0; the curve 1303 shows the phase noise for a tuning parameter of +25; the curve 1304 shows the phase noise for a tuning parameter of +85; and the curve 1305 shows the phase noise for a tuning parameter of +125. A graph 1400 in FIG. 14 shows a curve 14 020 phase noise for a core of 10 Hz with a local minima at a horizontal axis tuning value of 5.0.

Referring now to FIGS. 15-18, FIG. 15 shows an example oscillator temperature calibration process 1500. In one example, the oscillator temperature calibration process 1500 is performed at initial system warm-up. In this or another implementation, the oscillator temperature calibration process 1500 is repeated periodically during operation, for example, at 224 and FIG. 2A above. The method 1500 begins at 5002, and the controller 130 changes the oscillator oven temperature setting at 1504. In one implementation, the controller 130 sets the reference control signal REFCON at the reference control output 133 to control an internal heater of the reference oscillator 120 to set the operating temperature of the reference oscillator 120. At 1506, the controller 130 records the frequency error from the molecular clock loop based on the signal at the input 131. The controller 130 determines at 15 only whether a further iteration is desired. If so (YES at 1508), the method 1500 returns to 1504 as described above. Otherwise (NO at 1508), the controller determines the oscillator oven temperature setting at 1510 for which the temperature coefficient of frequency (TCF) is minimal or zero. Once the oscillator temperature calibration process 1500 is completed, the controller resumes normal operation at 202 in FIG. 2 above.

Figure 16:
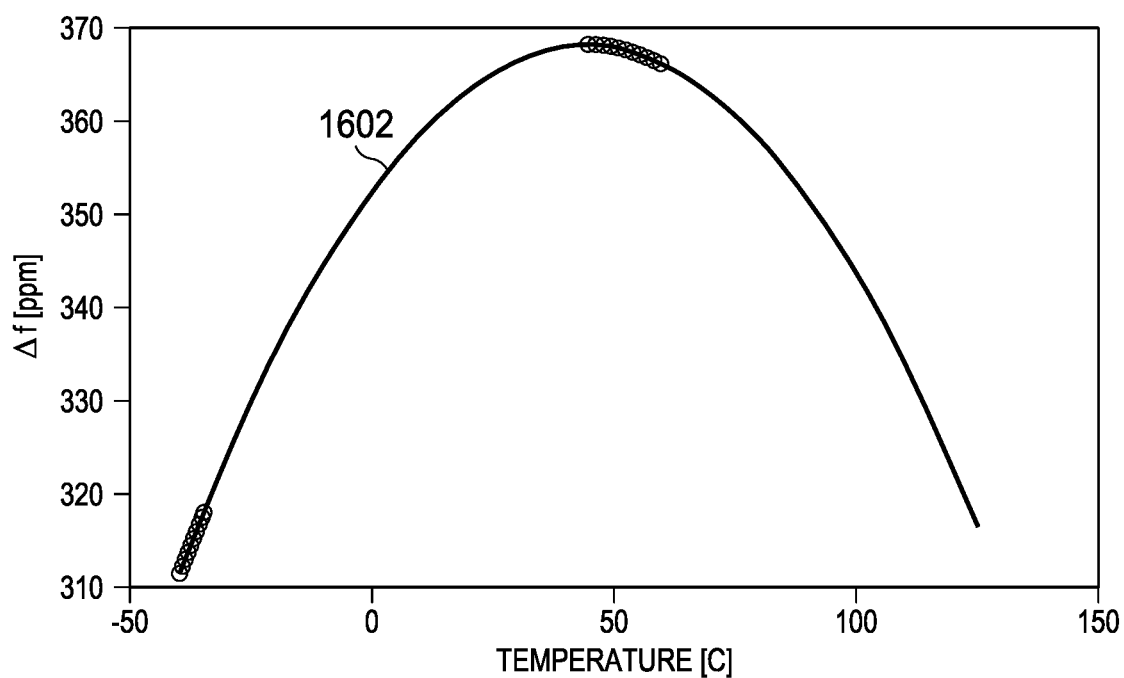
FIG. 16 is a graph of oscillator temperature coefficient of frequency.

FIG. 16 shows a graph 1600 with an example curve 1602 of oscillator temperature coefficient of frequency (Δf in ppm) as a function of temperature for the reference oscillator 120. The controller 130 implements the calibration process 1500 to characterize the effect of temperature ramp on the reference oscillator 120. The effect of temperature on the reference oscillator 120 creates an offset Δf_locking in the loop locking frequency of the closed loop and affects the long-term stability of the frequency of the oscillator output signal VOSC. The controller 130 in one example determines a local maxima of the curve 1602 in FIG. 16 at which the slope of the curve 1602 is at or near zero.

Figure 17:
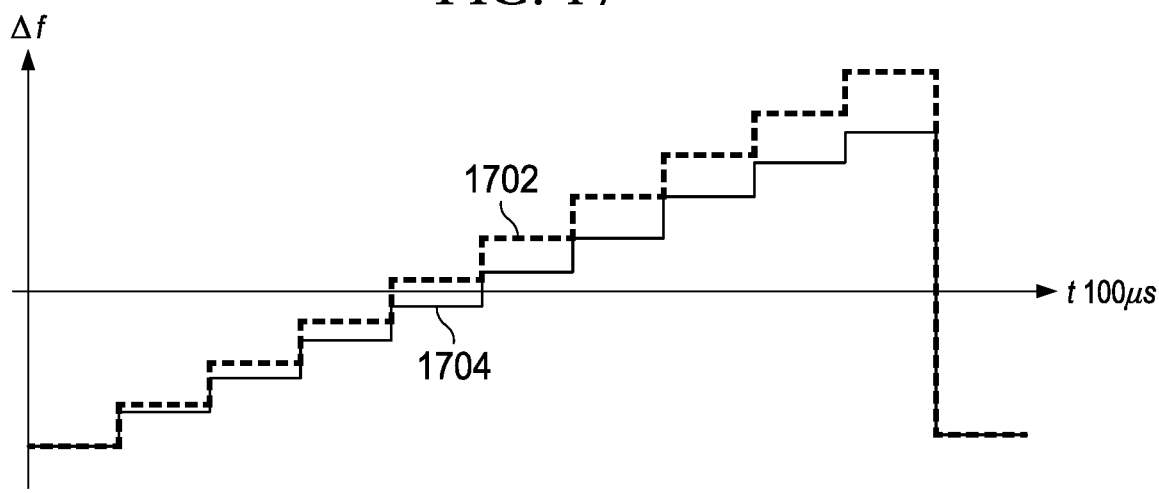
FIG. 17 is a graph of frequency change as a function of temperature ramp steps.

FIG. 17 shows a graph 1700 with curves seven 1702 and 1704 of frequency change as a function of temperature for ramped frequency step changes. The curve 1702 represents the frequency change during step increases in the first divisor value FMODCON in a first direction by the controller 130 while the reference oscillator 120 is operated at a first temperature, and the controller 130 concurrently shifts the second divisor value FOCON in an opposite second direction. The curve 1704 shows a similar stepped frequency increase by the controller 130 by increasing the first divisor value FMODCON in the first direction while the reference oscillator 120 is operated at a different second temperature, and the controller 130 concurrently shifts the second divisor value FOCON in the opposite second direction. The controller 130 in one example implements similar perturbation and measurement of responsive signals at the input 131 at 1504 and 1506 in FIG. 15 to evaluate the reference oscillator performance at two or more different temperatures.

Figure 18:
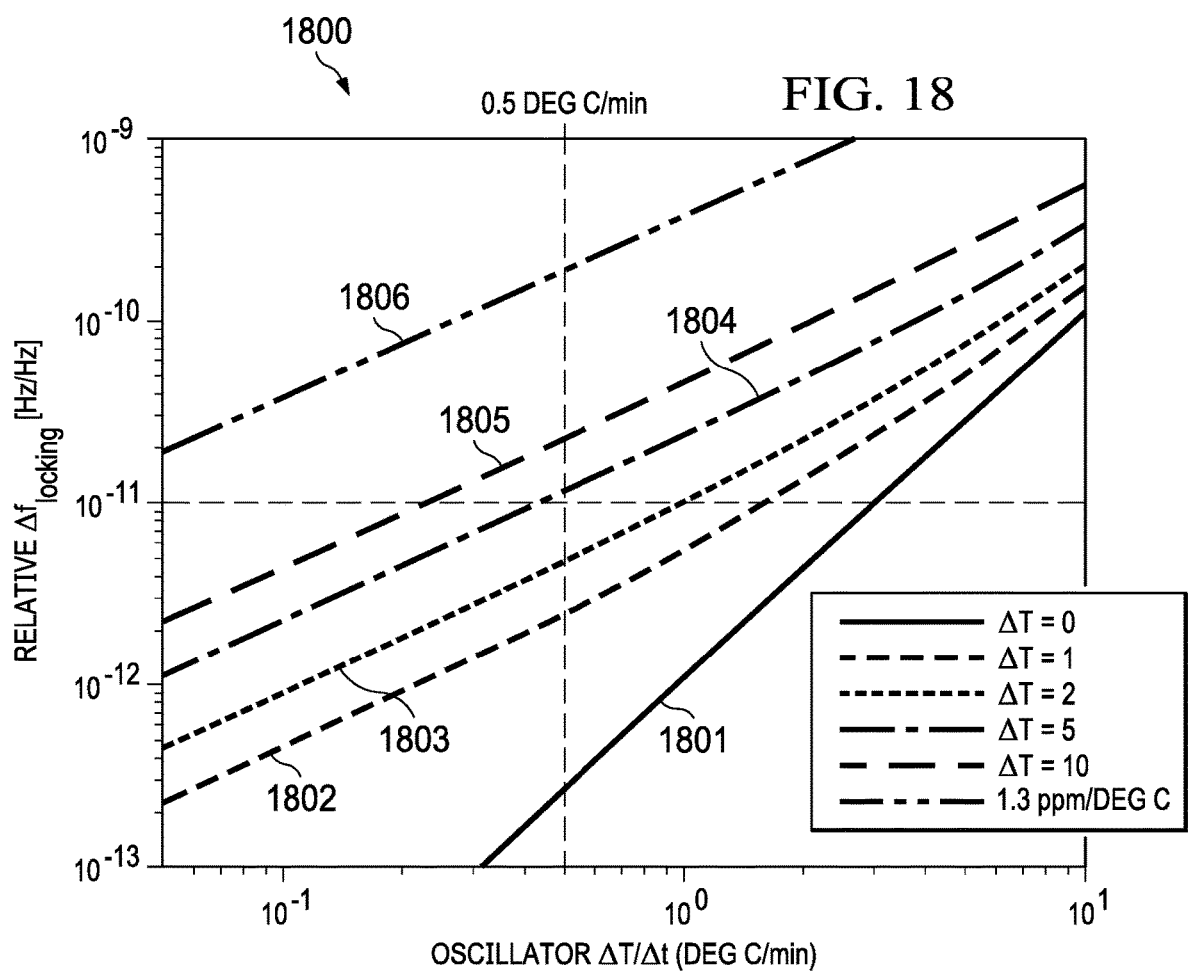
FIG. 18 is a graph of temperature drift for different oscillator temperatures.

FIG. 18 shows a graph 1800 with curves 1801, 1802, 1803, 1804, 1805, and 1806 showing relative frequency change locking (e.g., labeled $\Delta f_{locking}$) in Hz/Hz indicating temperature drift for different oscillator temperature change values ΔT as a function of oscillator temperature change rate ΔT/Δt in degrees C. per minute. The curve 1801 corresponds to the temperature change value ΔT=0; the curve 1802 corresponds to the temperature change value ΔT=1; the curve 1803 corresponds to the temperature change value ΔT=2; the curve 1804 corresponds to the temperature change value ΔT=5; the curve 1805 corresponds to the temperature change value ΔT=10; and the curve 1806 shows the oscillator performance for 1.3 ppm/degree C.

Figure 19:
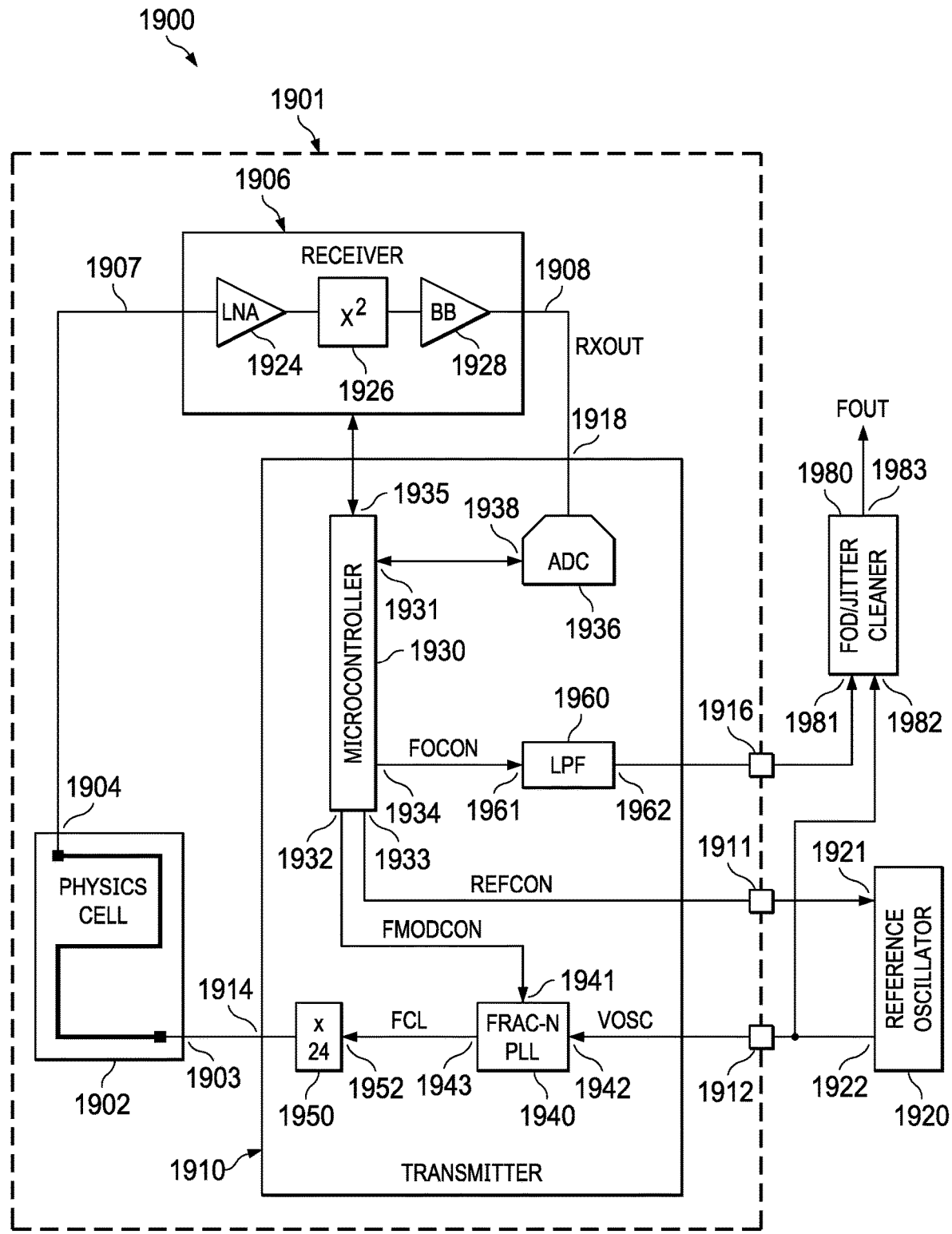
FIG. 19 is a schematic diagram of another clock system with a PLL, transmitter, physics cell, and a receiver in a closed loop, and an output clock circuit to provide an output clock signal.

FIG. 19 shows another clock system 1900 with an external output clock circuit 1980 to provide an output clock signal FOUT. In one implementation, the external output clock circuit 1980 is or includes a fractional output divider (FOD). In another implementation, the external output clock circuit 1980 is or includes a high-performance/low noise fractional-N PLL, referred to as a jitter cleaner. In another implementation, the external output clock circuit 1980 is or includes an integer-N PLL, for example, for high-performance applications such as wireline communications or base stations. The clock system 1900 includes a molecular clock electronic device 1901 operatively coupled to the external output clock circuit 1980 and an external reference oscillator 1920. The electronic device 1901 includes a physics cell 1902, a receiver 1906, a transmitter 1910, an oscillator control output terminal 1911, an oscillator input terminal 1912, and an output terminal 1916 that provides a divisor value to the external output clock circuit 1980. The electronic device 1901 and the schematically illustrated circuitry thereof are or include internal circuit components, such as transistors, resistors, capacitors, programmed and/or programmable processing or logic circuits and components configured to implement the functions described herein.

The physics cell 1902 has an input 1903 and an output 1904. The receiver 1906 has an input 1907 and an output 1908. The input 1907 of the receiver 1906 is coupled to the output 1904 of the physics cell 1902. The transmitter 1910 has a signal output 1914 and a signal input 1918. The system 1900 includes a reference oscillator 1920 having a control input 1921 and a signal output 1922. The control input 1921 of the reference oscillator 1920 is coupled to the oscillator control output terminal 1911. The signal output 1922 of the reference oscillator 1920 is coupled to the oscillator input terminal 1912.

The receiver 1906 includes a low noise amplifier 1924 (e.g., labeled "LNA"), a square-law detector 1926 (e.g., labeled "$X^2$"), and a baseband amplifier 1928 (e.g., labeled "BB"). An input of the low noise amplifier 1924 is coupled to the input 1907, and an output of the low noise amplifier 1924 is coupled to an input of the square-law detector 1926. An output of the square-law detector 1926 is coupled to an input of the baseband amplifier 1928. An output of the baseband amplifier 1928 is coupled to the output 1908 of the receiver 1906. The receiver 1906 as well as the low noise amplifier 1924, square-law detector 1926 and baseband amplifier 1928 thereof receive a signal from the output 1904 of the physics cell 1902 and generate or otherwise provide an analog receiver output signal RXOUT at the output 1908 responsive to and based at least partially on the signal from the physics cell 1902.

The low noise amplifier 1924, the square-law detector 1926 and the baseband amplifier 1928 are or include RF circuitry. In one example, the low noise amplifier 1924 operates around the molecular frequency (e.g., 120 GHz). In another example, the low noise amplifier 1924 can be omitted, depending on the performance of the square-law detector 1926. The square-law detector 1926 in one example is a standard square-law detector that detects the power and amplitude of the incoming RF signal and performs amplitude demodulation. The input in one example is at 120 GHz, and the output of the square-law detector 1926 is only the amplitude modulation. In one example, the multiplier 1950 of the transmitter amplitude modulates the signal provided to the physics cell 1902 at a modulation frequency for the molecular clock loop (e.g., 5 kHz or close to DC). The baseband amplifier 1928 amplifies the signal from the square-law detector 1926 for improved performance of the ADC 1936. In another implementation, the baseband amplifier 1928 is omitted, for example, depending on the performance of the ADC 1936, which may include internal automatic gain control (AGC) circuitry.

The transmitter 1910 includes a controller 1930 (e.g., labeled "MICROCONTROLLER", an analog to digital converter 1936 (e.g., labeled "ADC"), a PLL 1940 (e.g., labeled "FRAC-N PLL"), a frequency multiplier 1950 (e.g., labeled "×24"), a low pass filter 1960 (e.g., labeled "LPF"), and an output clock circuit 1980 (e.g., labeled "FOD OR PLL"). The controller 1930, the PLL 1940, and the frequency multiplier 1950 of the transmitter 1910 are coupled in a closed loop with the physics cell 1902 and the receiver 1906. The output clock circuit 1980 provides an output clock signal FOUT having an output frequency. The controller 1930 in this example is configured for operation as described above in connection with the controller 130.

The controller 1930 has an input 1931, a first control output 1932, a reference control output 1933, a second control output 1934, and an output 1935. The output 1935 of the controller 1930 is coupled to the receiver 1906. The ADC 1936 has an input and an output 1938. In one example, the controller 1930 provides one or more control signals to the receiver 1906 via the output 1935, for example, to calibrate the parameters of the receiver 1906. For example, if there is a known drop in gain of the low noise amplifier 1924, or the baseband amplifier 1928 with respect to temperature, the controller 1930 sends a digital signal to the receiver 1906 via of the output 1935 to control the gain to compensate for this gain loss, in response to the controller 1930 determining that the temperature has drifted enough. In another example, the controller 1930 performs automatic gain control by adjusting the gain of one or both of the amplifiers 1924, 1928 in response to converted values received at the controller input 1931 from the output 1938 of the ADC 1936 are of a low amplitude to utilize more of the input range of the ADC 1936.

The PLL 1940 has a control input 1941, a reference input 1942, and an output 1943, and operates in one example as described above in connection with FIG. 1A, including a divider circuit having an input coupled to the PLL output 1943 and a modulation divisor control circuit having an input coupled to the control input 1941 of the PLL 1940.

The frequency multiplier 1950 has an input 1952 coupled to the output 1943 of the PLL 1940, and an output coupled to the output 1914 of the transmitter 1910. The low pass filter 1960 has an input 1961 and an output 1962. The output clock circuit 1980 has a control input 1981, a reference input 1982 coupled to the oscillator output 1922, and an output 1983 that provides the frequency output signal FOUT. The reference input 1942 of the PLL 1940 is coupled to the oscillator input terminal 1912, and the output 1943 of the PLL 1940 is coupled to the signal output 1914 of the transmitter 1910.

The input 1961 of the low pass filter 1960 is coupled to the second control output 1934 of the controller 1930. The output 1962 of the low pass filter 1960 is coupled to the control input 1981 of the external output clock circuit 1980 via the output terminal 1916. In another implementation, the low pass filter 1960 is omitted and the second control output 1934 of the controller 1930 is coupled directly to the output terminal 1916. The control input 1981 of the output clock circuit 1980 is coupled to the second control output 1934 of the controller 1930. The reference input 1982 of the output clock circuit 1980 is coupled to the oscillator input terminal 1912. The output 1983 of the output clock circuit 1980 is coupled to the output terminal 1916. The first control output 1932 of the controller 1930 is coupled to the control input 1941 of the PLL 1940.

The reference control output 1933 of the controller 1930 is coupled to the oscillator control output terminal 1911. The controller 1930 in one example provides a reference control signal REFCON at the reference control output 1933 to control an oscillator operating parameter of the reference oscillator 1920, such as temp, frequency, noise tuning, etc. In one example, the reference control signal REFCON is a digital signal, for example conveyed from the controller 1930 as one or more command messages to the reference oscillator 1920 by a digital control bus. In one implementation, the reference oscillator 1920 includes heating elements for controlling the temperature of the oscillator circuitry and the reference control signal REFCON controls the oscillator temperature, for example, for use in temperature calibration operations as discussed further below. In this or another implementation, the reference control signal REFCON controls a noise-tuning parameter of the reference oscillator 1920, for example, to control or enhance noise performance. In this or another implementation, the reference control signal REFCON sets or controls a coarse frequency adjustment feature of the reference oscillator 1920, for example, to bring the frequency of the oscillator output signal close enough for molecular clock loop operation (e.g., within few ppm).

The reference oscillator 1920 provides an oscillator output signal VOSC at the signal output 1922. The oscillator output signal VOSC provides a frequency reference input to the reference input 1942 of the PLL 1940 and to the reference input 1982 of the external output clock circuit 1980. In one example, the output clock circuit 1980 is or includes a PLL. In another example, the output clock circuit 1980 is or includes a fractional output divider (FOD) capable of frequency multiplication by fractional values in addition to integer values. The FOD in one example performs a fractional division by moving the edges of the output clock.

The controller 1930 in one example is or includes programmable or programmed logic circuitry, such as a programmed processor, as well as analog and digital interface circuitry to generate analog and digital signals, and to receive analog and/or digital signals. The input 1931 of the controller 1930 is coupled to the ADC output 1938. In operation, the controller 1930 provides a first divisor value FMODCON at the first control output 1932 to regulate the closed loop that includes the physics cell 1902, the receiver 1906, and the PLL 1940 based on a signal RXOUT at the input 1931 of the controller 1930. The frequency of the closed loop frequency output signal FCL is multiplied by the multiplier circuit 1950, and the multiplier 1950 provides an output signal to the input 1903 of the physics cell 1902.

In one example, the first divisor value FMODCON is a digital value representing an integer or fractional divisor value N. In one implementation, the controller 1930 directly sends the value N in the signal FMODCON. In another implementation, the PLL 1940 includes internal memory (not shown) that stores a set of divisor values (integer and/or fractional) in a look-up table and the controller 1930 sends the signal FMODCON as a single control bit that controls the PLL 1940 to advance to the next entry in the lookup table value. In another example, the first divisor value FMODCON is an encoded value that is decoded by the PLL 1940 to set a divisor that controls the output frequency of the closed loop frequency output signal FCL. In another implementation, the first divisor value FMODCON is a pulse or single data bit that instructs the PLL 1940 to increase or decrease the divisor value, or to select from a set of stored divisor values in the output clock circuit 1980, to control the output frequency of the closed loop frequency output signal FCL.

In one example, the PLL 1940 is an integer-N PLL and the frequency of the closed loop frequency output signal FCL is a rational multiple of the reference frequency of the oscillator output signal VOSC. In another example, the PLL 1940 is a fractional N (FRAC-N) PLL.

The controller 1930 provides a second divisor value FOCON at the second control output 1934 based on the signal at the input 1931 of the controller 1930 to control (e.g., regulate) the output frequency of the output clock signal FOUT generated by the external output clock circuit 1980. In one example, the second divisor value FOCON is a digital value representing an integer divisor value. In another example, the second divisor value FOCON is an encoded value that is decoded by the output clock circuit 1980 to set a divisor that controls the output frequency of the output clock signal FOUT. In another implementation, the second divisor value FOCON is a pulse or single data bit that instructs the output clock circuit 1980 to increase or decrease the divisor value, or to select from a set of stored divisor values in the output clock circuit 1980, to control the output frequency of the output clock signal FOUT.

The low pass filter 1960 is included in one implementation and provides digital low pass filtering of the second divisor values FOCON provided by the controller 1930 at the second control output 1934. In another implementation, the low pass filter 1960 is omitted, and the second control output 1934 is connected directly to the output terminal 1916. In one implementation, the external output clock circuit 1980 is a PLL, such as an integer N PLL or a fractional N PLL. In operation, the controller 1930 controls the PLL 1940 and the external output clock circuit 1980 by changing their integer or fractional divisors "N" via the respective signals FMODCON and FOCON. The low pass filter is a digital low-pass filter. As the reference oscillator 1920 starts to drift due to temperature or aging, the loop including the PLL 1940, the multiplier 1950, the physics cell 1902, the receiver 1906, the ADC 1936 and the controller 1930 detects a frequency shift in the molecular clock operation based on the signal at the input 1931 of the controller 1930. In response, in steady state operation, the controller 1930 applies the second divisor value FOCON at the output 1934 to adjust the divisor of the output clock circuit 1980 to compensate for the drift in the oscillator output signal VOSC and maintain the frequency of the frequency output signal FOUT at a fixed or generally constant value.

The low-pass filter 1960 limits the bandwidth of the digital correction signal and mitigates or avoids perturbing the output phase noise at higher offsets. In one implementation, the low-pass filter 1960 implements decimation, for example, where the molecular clock loop is running at a sample rate of 10,000 frequency measurements per second, and the controller 1930 generates 10,000 corresponding correction signals in the form of the second divisor values FOCON per second. In this example, the second divisor values FOCON may be limited to a small number of bits, leading to large quantization noise. In operation, the low-pass filter 1960 in one example averages a number of the second divisor values FOCON, such as 1000 samples, and produces a small number of samples at the output 1962 of the low-pass filter (e.g., 10 values per second). The divisor of the output clock circuit 1980 is set by the 10 samples per second, which can be of a much finer resolution than the second divisor values FOCON from the output 1934 of the controller 1930, and the use of the low-pass filter 1960 reduces quantization noise and mitigates or avoids contamination of the output spectrum of the output clock circuit 1980. In one example, the inclusion of the low-pass filter

1960 provides an extra degree of freedom with separate control for the molecular clock loop bandwidth, and the output clock circuit 1980. The reference oscillator 1920 provides the oscillator output signal VOSC as a frequency reference input to the reference input 1982 of the output clock circuit 1980.

The controller 1930 provides the second divisor values FOCON to control the output frequency of the output clock signal FOUT in first and second modes in the illustrated example. The controller 1930 operates in a first mode for steady state operation and performs calibration operations in a second mode with perturbations of the closed loop that includes the transmitter 1910, the physics cell 1902, the receiver 1906, and the PLL 1940. The controller 1930 creates perturbations in the closed loop that includes the physics cell 1902, the receiver 1906, the transmitter 1910 and the PLL 1940 by adjusting or shifting the first divisor value FMODCON. The controller 1930 monitors the receiver output signal RXOUT from the receiver output 1908 in the form of digital values converted by the ADC 1936 and received at the input 1931 of the controller 1930. The controller 1930 in various implementations assesses the closed loop response, which includes the response of the physics cell 1902, to the applied perturbations. In normal study state operation in the first mode, the controller 1930 implements output frequency regulation based on the signals received at the input 1931 to try to maintain the frequency of the frequency output signal FOUT constant.

In the second mode, the controller 1930 performs one or more calibration operations, including applying perturbations to the closed loop by adjusting or shifting the first divisor value FMODCON, referred to herein as shifts or shifting. The controller 1930 measures the response of the physics cell and the other components of the closed loop based on the signal received at the input 1931. In addition, the controller 1930 separately shifts the second divisor value FOCON to mitigate or avoid interruptions in the constant frequency of the frequency output signal FOUT in the opposite direction during such perturbation/measurement calibration operations in the second mode. In one implementation, the respective first and second divisor values FMODCON and FOCON are substantially equal during steady state operation. In another implementation, the divisor values FMODCON and FOCON are not equal during steady state operation in the first mode, and either or both of these values may vary slightly under control of the controller 1930.

In the second mode, the controller 1930 shifts the first divisor value FMODCON in a first direction to cause a perturbation in the closed loop, and concurrently shifts the second divisor value FOCON in an opposite second direction to counteract a response of the closed loop to the perturbation and to regulate the output frequency of the output clock signal FOUT. The controller 1930 analyzes the response of the closed loop to the perturbation based on the signal at the input 1931 of the controller 1930. The configuration of the PLL 1940 within the closed loop and the output clock circuit 1980 outside the closed loop enables the controller 1930 to perform various operations such as calibration during normal operation without disturbing the frequency of the output clock signal FOUT. This controller 1930 is configured to implement that methods and processes described above in connection with FIGS. 2, 3, 8, 12, and 15 and allows calibration for temperature, aging, and other effects on the signal channel that could not be addressed in molecular clock systems in which the output frequency was generated within the closed loop.

In one implementation, the controller shifts the first divisor value FMODCON by a first amount in the first direction to cause the perturbation in the closed loop and shifts the second divisor value FOCON by the first amount in the opposite second direction to counteract the response of the closed loop to the perturbation and to regulate the output frequency of the output clock signal FOUT. In another implementation, the controller 1930 shifts the respective first and second divisor values FMODCON and FOCON in opposite directions by different amounts.

In one example, the controller 1930 causes a single pulse type perturbation in the closed loop circuitry by shifting the respective first and second divisor values FMODCON and FOCON, and then shifts the respective first and second divisor values FMODCON and FOCON back to their starting values. In other examples, the controller 1930 applies a perturbation by concurrently shifting the respective first and second divisor values FMODCON and FOCON in opposite directions in steps, or by ramps, or sweeps, or other forms of value shifting or combinations thereof, for example, to perform a frequency shift in the transmitter output. In one implementation, the controller 1930 performs one or more calibration operations including applying perturbations and associated analysis of the responsive signal received at the controller input 1931.

The controller 1930 analyzes the received signal to determine a divisor value and corresponding frequency at or near a local minima of an absorption parameter of the physics cell 1902. The controller operation in the first and second modes facilitates use of a reference oscillator 1920 and the electronic device 1901 as a clock source that is corrected by the molecular clock configuration with the physics cell 1902 in a closed loop. The illustrated circuit configuration and controller operation also facilitate calibration capabilities to accommodate ageing, temperature variations and other error sources while maintaining ultra-stable frequency of the output clock signal FOUT (e.g., sub-parts per billion or sub-ppb).

Modifications are possible in the described examples, and other implementations are possible, within the scope of the claims.

What is claimed is:

1. An electronic device, comprising: an oscillator input terminal; an output terminal; a physics cell, having an input and an output; a receiver, having an input and an output, the input of the receiver coupled to the output of the physics cell; and a transmitter having a signal input, a signal output, an analog to digital converter (ADC), a phase-locked-loop (PLL), an output clock circuit, and a controller;

the signal input coupled to the output of the receiver; the signal output coupled to the input of the physics cell; the ADC having an input and an output, the input of the ADC coupled to the signal input; the PLL having a control input, a reference input, and an output, the reference input coupled to the oscillator input terminal, and the output of the PLL coupled to the signal output of the transmitter; the controller having an input, a first control output, and a second control output, the input of the controller coupled to the output of the ADC, the first control output of the controller coupled to the control input of the PLL; the output clock circuit having a control input, a reference input, and an output, the control input of the output clock circuit coupled to the second control output of the controller, the reference input of the output clock circuit coupled to the oscillator input terminal, and the output of the output clock circuit coupled to the output terminal; the controller configured to provide a first divisor value at the first control output based on a signal at the input of the controller; and the controller configured to provide a divisor value at the second control output based on the signal at the input of the controller.

2. The electronic device of claim 1, wherein:
the output clock circuit is configured to provide an output clock signal at the output of the output clock circuit;
the controller is configured to provide the first divisor value at the first control output to regulate a closed loop that includes the physics cell, the receiver, and the PLL based on the signal at the input of the controller; and
the controller is configured to provide the second divisor value at the second control output to control an output frequency of the output clock signal based on the signal at the input of the controller.

3. The electronic device of claim 2, wherein the controller is configured to:
shift the first divisor value in a first direction to cause a perturbation in the closed loop;
shift the second divisor value in an opposite second direction to counteract a response of the closed loop to the perturbation and to regulate the output frequency of the output clock signal; and
analyze the response of the closed loop to the perturbation based on the signal at the input of the controller.

4. The electronic device of claim 3, wherein the controller is configured to:
shift the first divisor value by a first amount in the first direction to cause the perturbation in the closed loop; and
shift the second divisor value by the first amount in the opposite second direction to counteract the response of the closed loop to the perturbation and to regulate the output frequency of the output clock signal.

5. The electronic device of claim 1, wherein the output clock circuit is a PLL or a fractional output divider (FOD).

6. The electronic device of claim 1, further comprising an oscillator control output terminal; wherein:
the controller comprises a reference control output coupled to the oscillator control output terminal; and
the controller is configured to provide a reference control signal at the reference control output to control an oscillator operating parameter.

7. The electronic device of claim 1, further comprising a low pass filter having an input and an output, the input of the low pass filter coupled to the second control output of the controller, and the output of the low pass filter coupled to the control input of the output clock circuit.

8. An electronic device, comprising: an oscillator input terminal; an output terminal; a physics cell, having an input and an output; a receiver, having an input and an output, the input of the receiver coupled to the output of the physics cell; and a transmitter having a signal input, a signal output, an analog to digital converter (ADC), a phase-locked-loop (PLL), and a controller;
the signal input coupled to the output of the receiver; the signal output coupled to the input of the physics cell; the ADC having an input and an output, the input of the ADC coupled to the signal input; the PLL having a control input, a reference input, and an output, the reference input coupled to the oscillator input terminal, and the output of the PLL coupled to the signal output of the transmitter; the controller having an input, a first control output, and a second control output, the input of the controller coupled to the output of the ADC, the first control output of the controller coupled to the control input of the PLL, and the second control output coupled to the output terminal; the controller configured to provide a first divisor value at the first control output based on a signal at the input of the controller; and the controller configured to provide a second divisor value at the second control output based on the signal at the input of the controller.

9. The electronic device of claim 8, wherein:
the controller is configured to provide the first divisor value at the first control output to regulate a closed loop that includes the physics cell, the receiver, and the PLL based on the signal at the input of the controller; and
the controller is configured to provide the second divisor value at the second control output to control an output frequency of an output clock signal based on the signal at the input of the controller.

10. The electronic device of claim 9, wherein the controller is configured to:
shift the first divisor value in a first direction to cause a perturbation in the closed loop;
shift the second divisor value in an opposite second direction to counteract a response of the closed loop to the perturbation and to regulate the output frequency of the output clock signal; and
analyze the response of the closed loop to the perturbation based on the signal at the input of the controller.

11. The electronic device of claim 10, wherein the controller is configured to:
shift the first divisor value by a first amount in the first direction to cause the perturbation in the closed loop; and
shift the second divisor value by the first amount in the opposite second direction to counteract the response of the closed loop to the perturbation and to regulate the output frequency of the output clock signal.

12. The electronic device of claim 8, further comprising an oscillator control output terminal; wherein:
the controller comprises a reference control output coupled to the oscillator control output terminal; and
the controller is configured to provide a reference control signal at the reference control output to control an oscillator operating parameter.

13. The electronic device of claim 8, further comprising a low pass filter having an input and an output, the input of the low pass filter coupled to the second control output of the controller, and the output of the low pass filter coupled to the control input of the output clock circuit.

14. A method, comprising:
providing an oscillator output signal to a reference input of a phase-locked-loop (PLL) and to a reference input of an output clock circuit;
based on a receiver output signal, providing a first divisor value to a control input of the PLL to regulate a closed loop that includes a physics cell, a receiver, and the PLL; and
based on the receiver output signal, providing a second divisor value to a control input of the output clock circuit to control an output frequency of an output clock signal.

15. The method of claim 14, further comprising:
shifting the first divisor value in a first direction to cause a perturbation in the closed loop;
shifting the second divisor value in an opposite second direction to counteract a response of the closed loop to the perturbation and to regulate the output frequency of the output clock signal; and based on the receiver output signal, analyzing the response of the closed loop to the perturbation.

16. The method of claim 15, comprising:

shifting the first divisor value by a first amount in the first direction to cause the perturbation in the closed loop; and shifting the second divisor value by the first amount in the opposite second direction to counteract the response of the closed loop to the perturbation and to regulate the output frequency of the output clock signal.

17. The method of claim 15, comprising:

analyzing the response of the closed loop to the perturbation in a background loop gain calibration.

18. The method of claim 15, comprising:

analyzing the response of the closed loop to the perturbation in a baseline slope calibration.

19. The method of claim 15, comprising:

analyzing the response of the closed loop to the perturbation in an oscillator phase noise calibration.

20. The method of claim 15, comprising:

analyzing the response of the closed loop to the perturbation in an oscillator temperature calibration.

\* \* \* \* \*